(12) United States Patent
Lee et al.

(10) Patent No.: US 12,471,493 B2
(45) Date of Patent: Nov. 11, 2025

(54) THERMOELECTRIC MODULE AND POWER GENERATION DEVICE INCLUDING SAME

(71) Applicant: LG INNOTEK CO., LTD., Seoul (KR)

(72) Inventors: Un Hak Lee, Seoul (KR); Sang Hoon Bong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 287 days.

(21) Appl. No.: 18/011,231

(22) PCT Filed: Jun. 16, 2021

(86) PCT No.: PCT/KR2021/007547
§ 371 (c)(1),
(2) Date: Dec. 19, 2022

(87) PCT Pub. No.: WO2021/256852
PCT Pub. Date: Dec. 23, 2021

(65) Prior Publication Data
US 2023/0255113 A1    Aug. 10, 2023

(30) Foreign Application Priority Data

Jun. 18, 2020 (KR) .................. 10-2020-0074231
Jun. 18, 2020 (KR) .................. 10-2020-0074232

(51) Int. Cl.
*H10N 10/13* (2023.01)
*H10N 10/17* (2023.01)

(52) U.S. Cl.
CPC ............. *H10N 10/13* (2023.02); *H10N 10/17* (2023.02)

(58) Field of Classification Search
CPC ................................. H10N 10/13; H10N 10/17
See application file for complete search history.

(56) References Cited

U.S. PATENT DOCUMENTS

2011/0239635 A1   10/2011  Prior et al.
2016/0329480 A1*  11/2016  Ahdoot ................ H10N 10/13
2021/0074901 A1*   3/2021  Jeon .................... H10N 10/13

FOREIGN PATENT DOCUMENTS

JP       11-036981       2/1999
JP      2002-280622      9/2002
(Continued)

OTHER PUBLICATIONS

International Search Report dated Sep. 28, 2021 issued in Application No. PCT/KR2021/007547.
(Continued)

*Primary Examiner* — Lindsey A Buck
(74) *Attorney, Agent, or Firm* — KED & ASSOCIATES, LLP

(57) ABSTRACT

A thermoelectric device according to an embodiment of the present invention comprises: a fluid flow part including one surface and the reverse surface spaced apart from the one surface in a first direction; a first thermoelectric element disposed on the one surface of the fluid flow part; a second thermoelectric element disposed on the reverse surface of the fluid flow part; a first shield member disposed on the first thermoelectric element; and a second shield member disposed on the second thermoelectric element, wherein the first shield member and the second shield member each include coupling holes, and the coupling holes of the first shield member and the coupling holes of the second shield member are arranged offset from each other in the first direction.

18 Claims, 19 Drawing Sheets

(56) References Cited

FOREIGN PATENT DOCUMENTS

| | | |
|---|---|---|
| JP | 2014-116505 | 6/2014 |
| KR | 10-2011-0096418 | 8/2011 |
| KR | 10-2016-0077078 | 7/2016 |
| KR | 10-2019-0065763 | 6/2019 |
| KR | 10-2019-0117134 | 10/2019 |
| KR | 10-2020-0005869 | 1/2020 |
| KR | 10-2083611 | 3/2020 |
| WO | WO 2019/194595 | 10/2019 |
| WO | WO-2019194595 A1 * | 10/2019 ............. H01L 35/02 |

OTHER PUBLICATIONS

European Search Report dated Jun. 10, 2024 issued in Application No. 21826521.3.
Korean Office Action dated Aug. 20, 2024 issued in Application No. 10-2020-0074231.
Korean Office Action dated Aug. 23, 2024 issued in Application No. 10-2020-0074232.
Japanese Office Action dated Nov. 19, 2024 issued in Application No. 2022-578705.

* cited by examiner

[FIG. 1]
1000
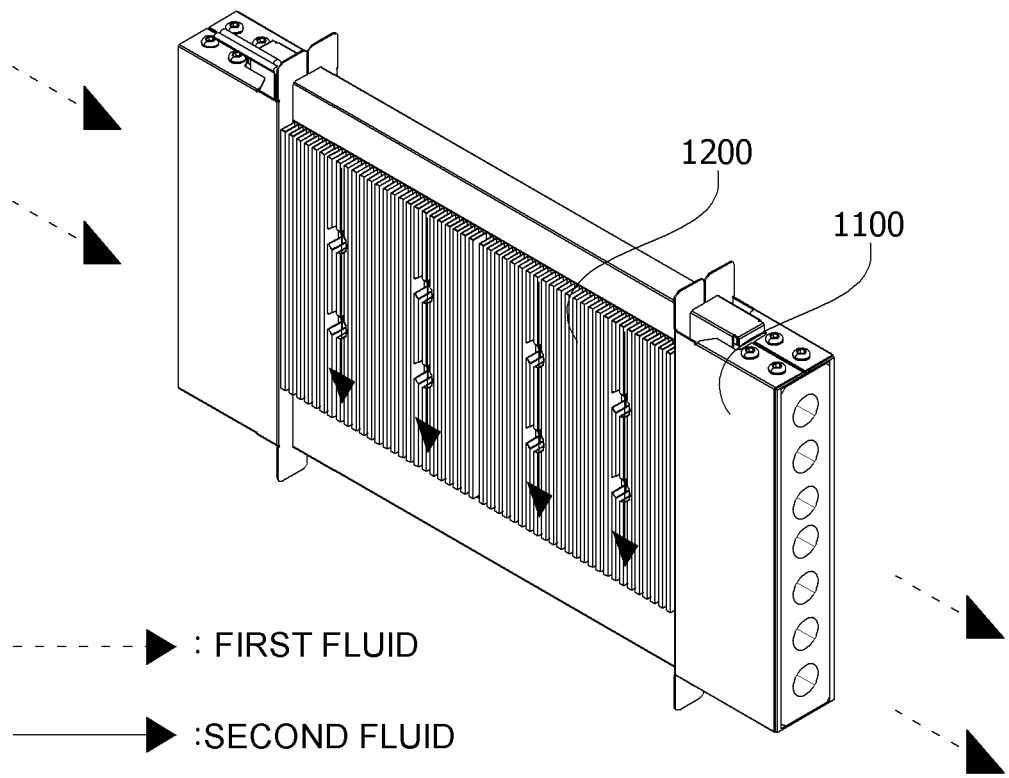
- - - ▶ : FIRST FLUID
——▶ :SECOND FLUID

[FIG. 2]
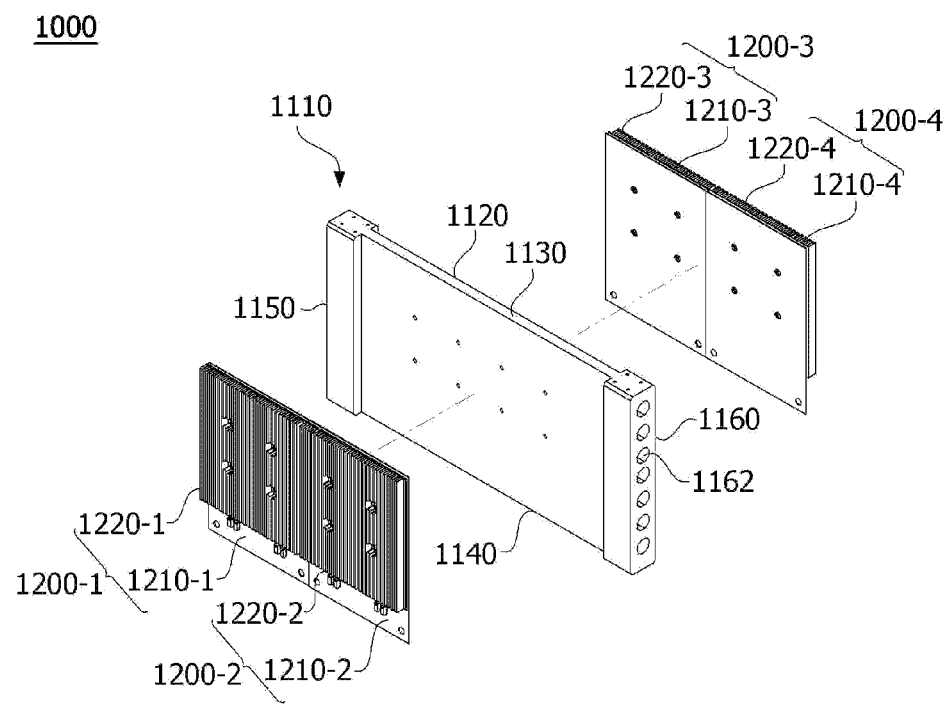
1200: 1200-1, 1200-2, 1200-3, 1200-4
1210: 1210-1, 1210-2, 1210-3, 1210-4
1220: 1220-1, 1220-2, 1220-3, 1220-4

[FIG. 3]
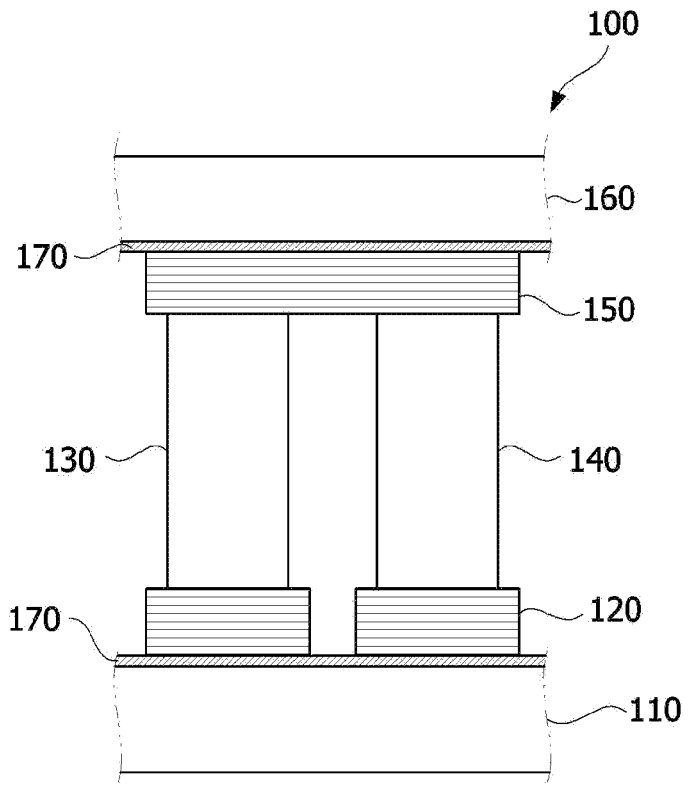
[FIG. 4]
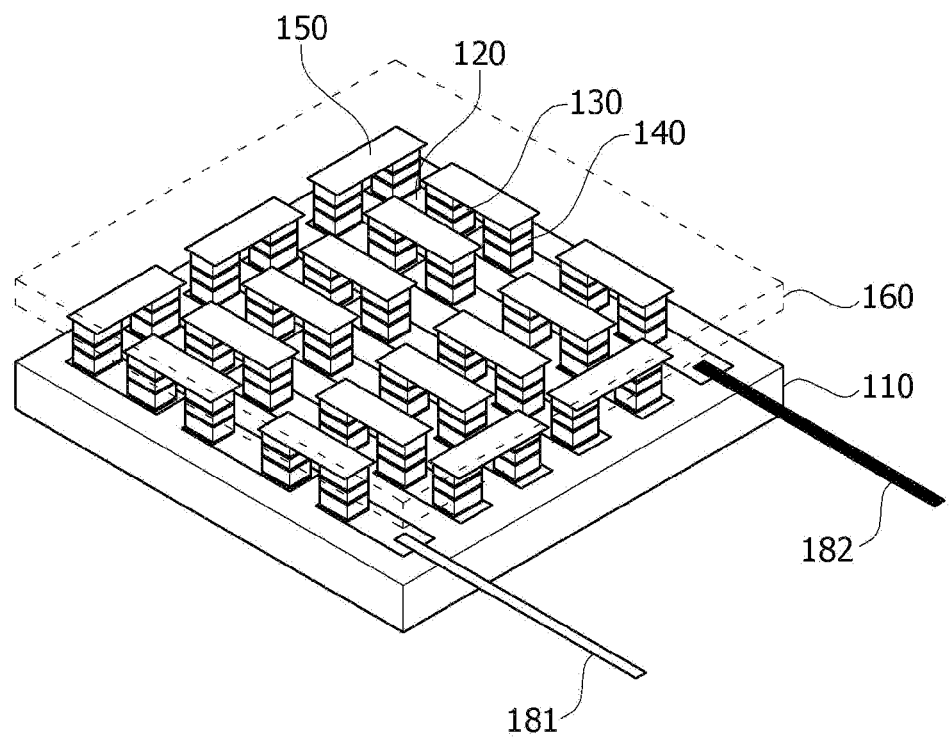

[FIG. 5]
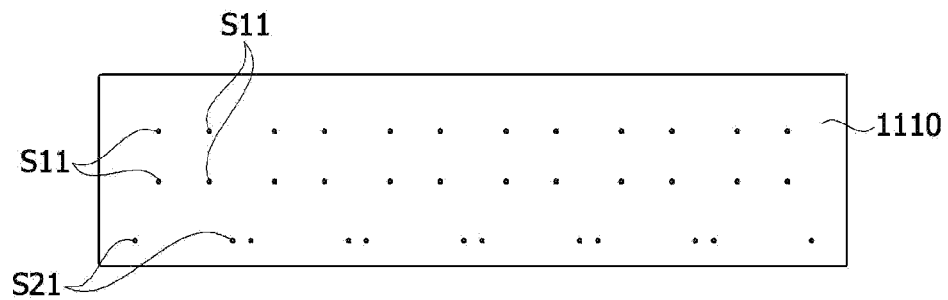
[FIG. 6]
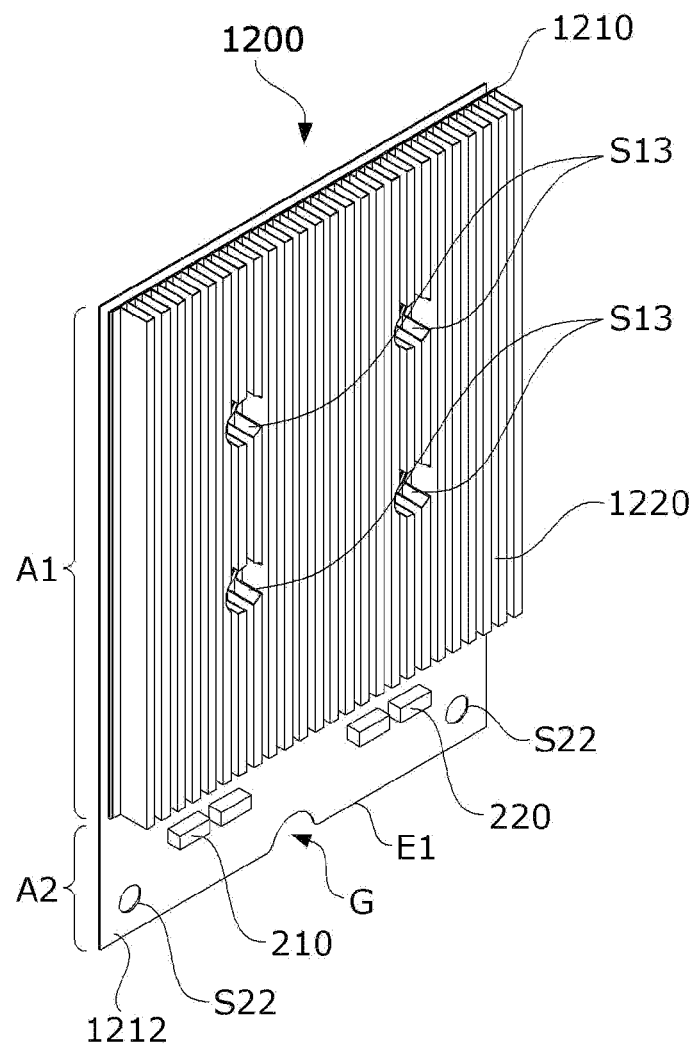

[FIG. 7]
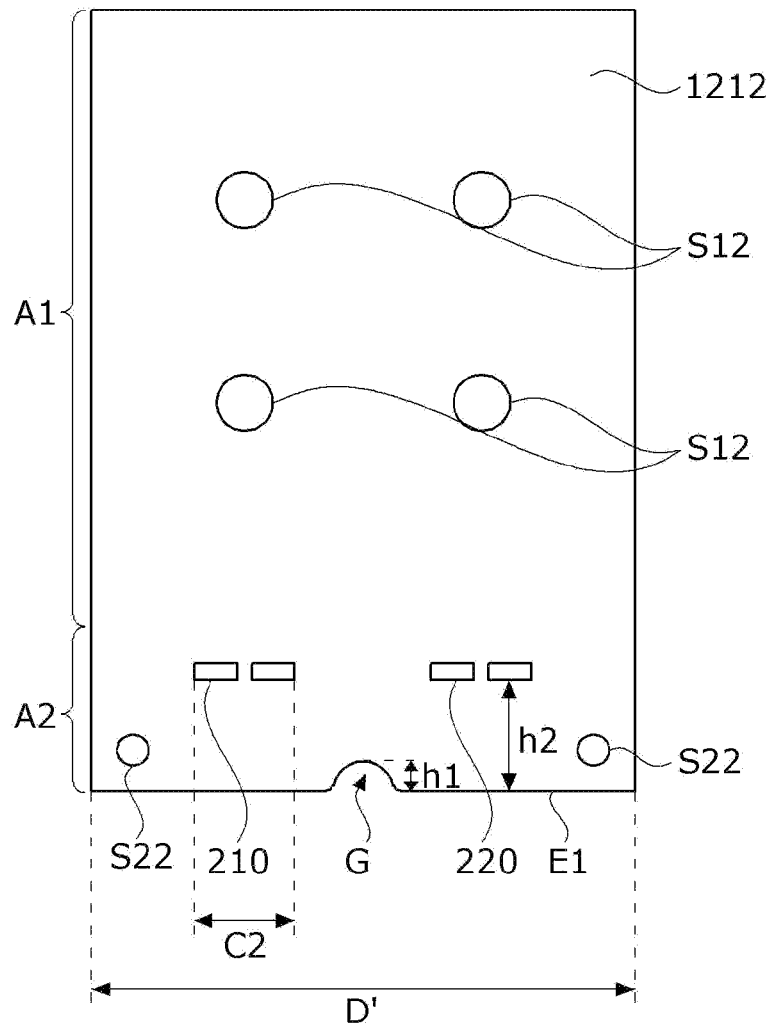
[FIG. 8]
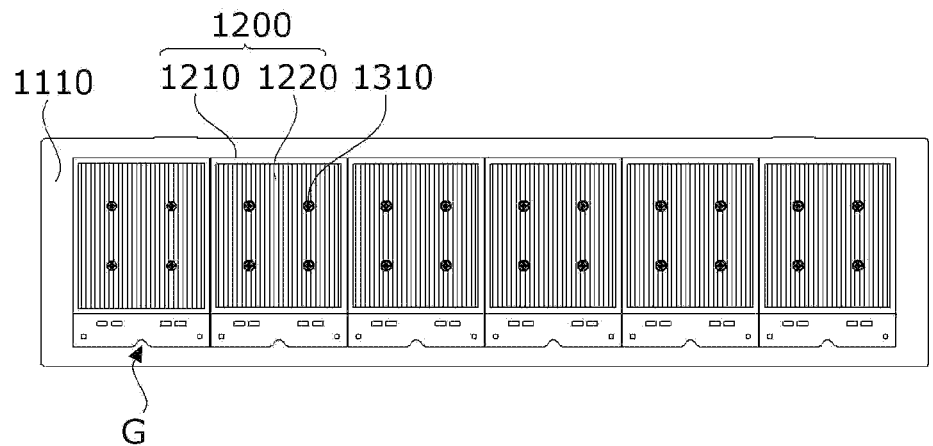

[FIG. 9]
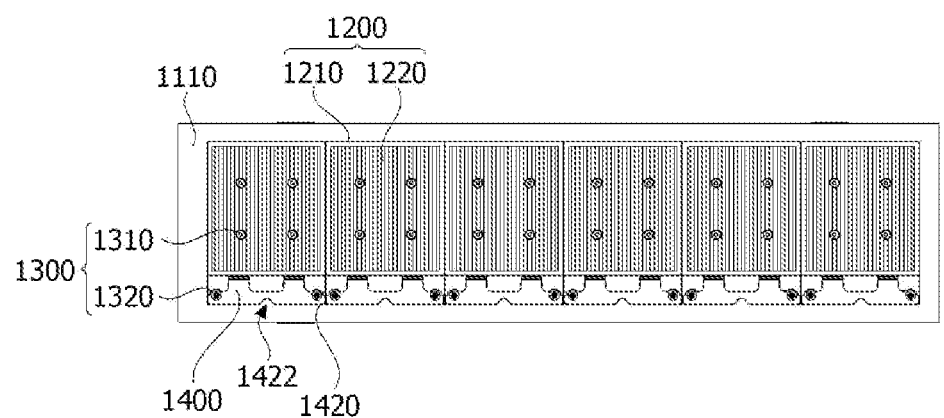
[FIG. 10]
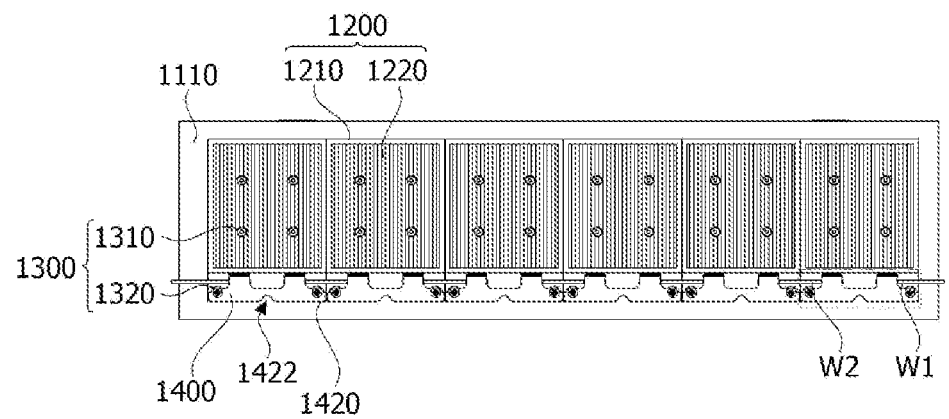

[FIG. 11]
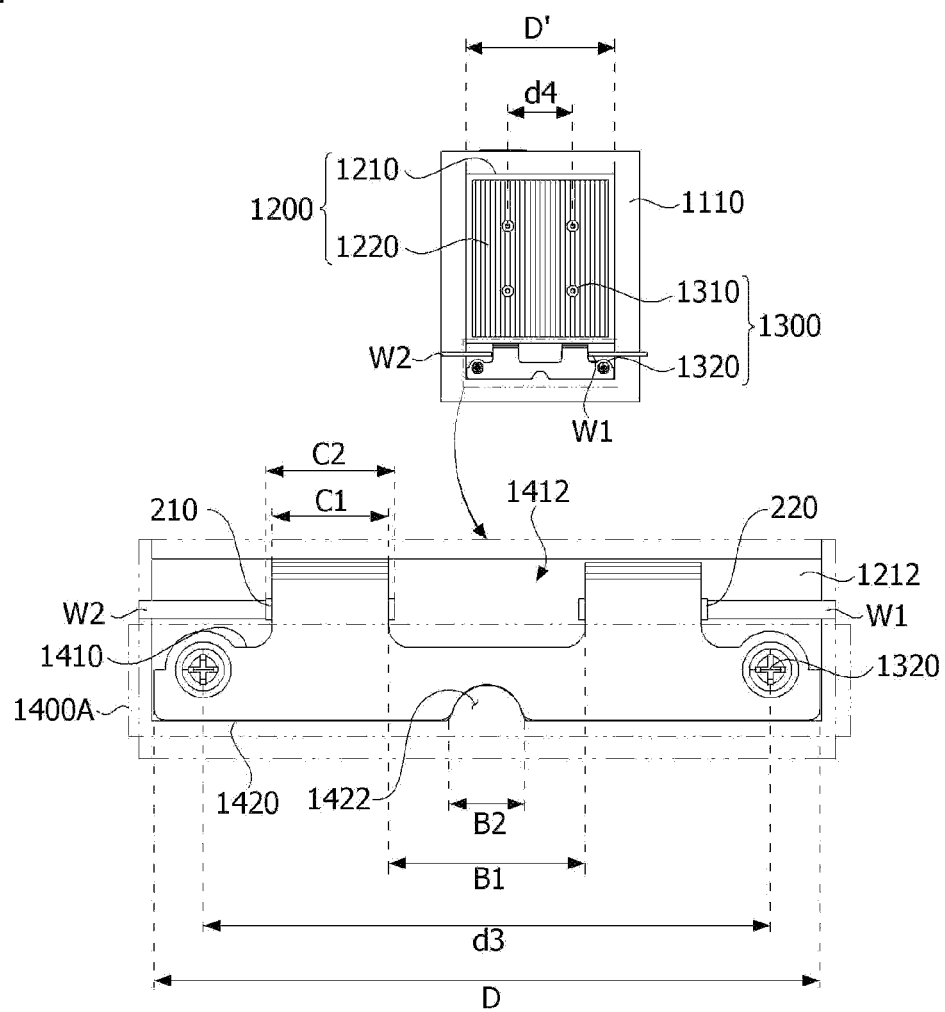

[FIG. 12]
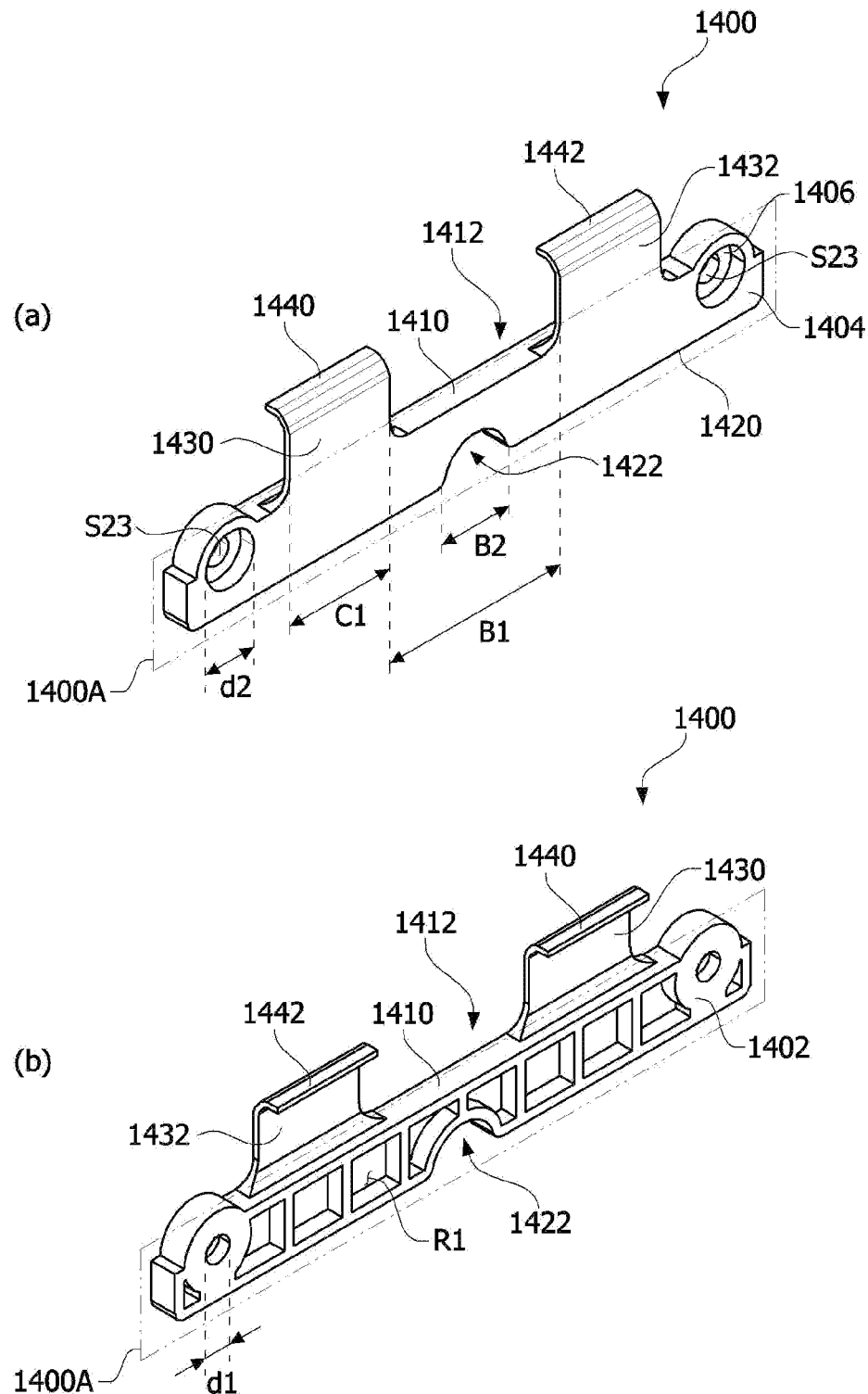

[FIG. 13]
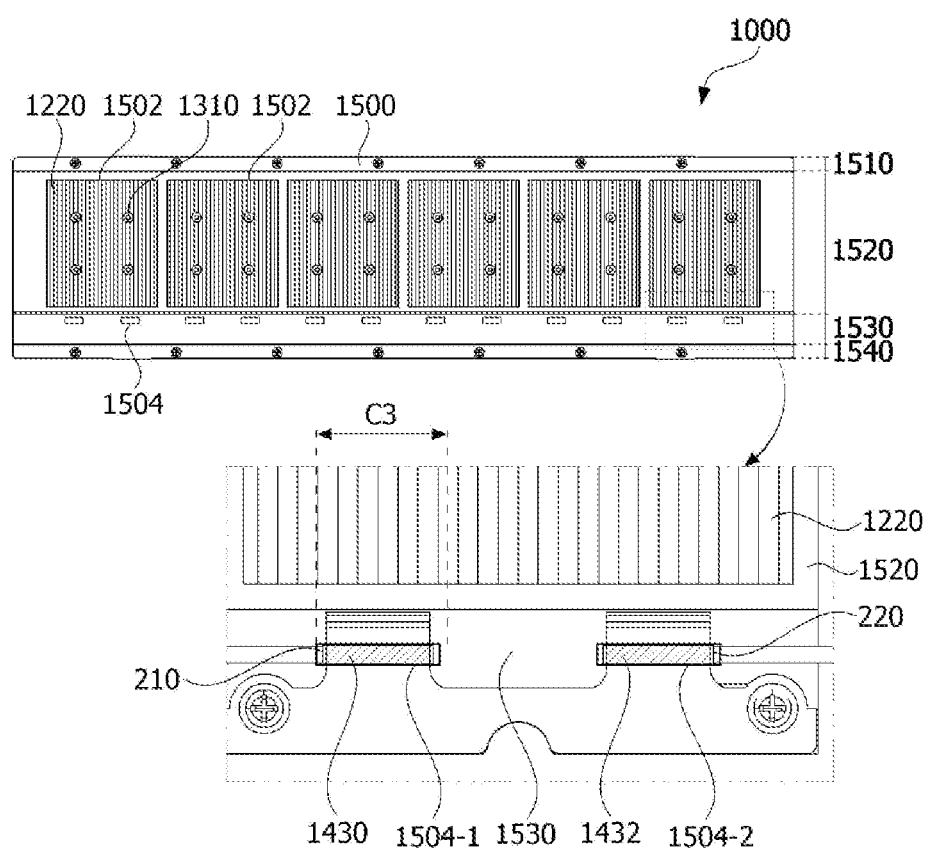

[FIG. 14]
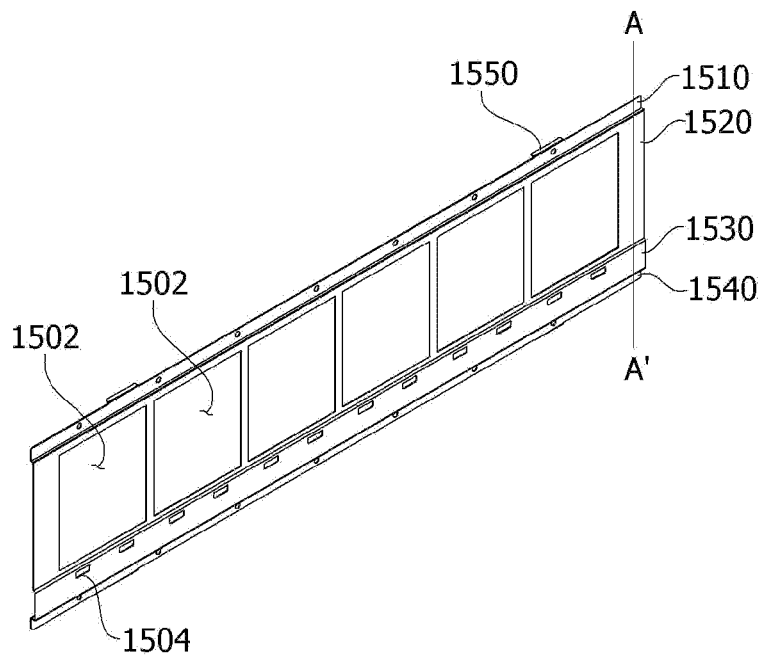
[FIG. 15]
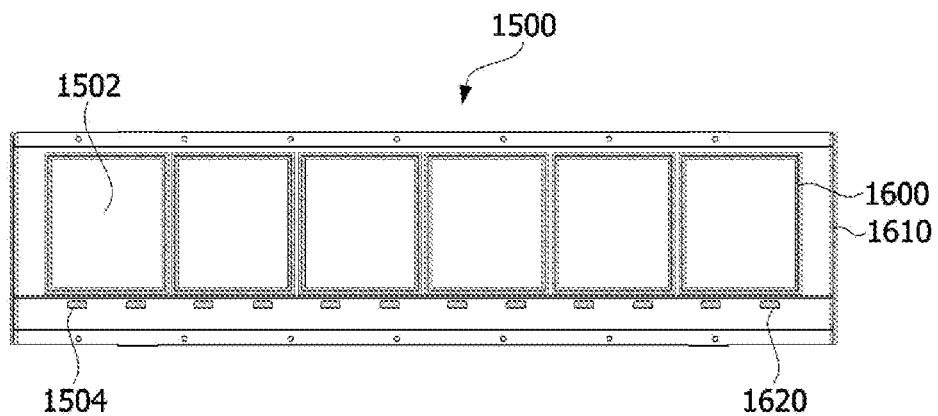
[FIG. 16]

[FIG. 17]
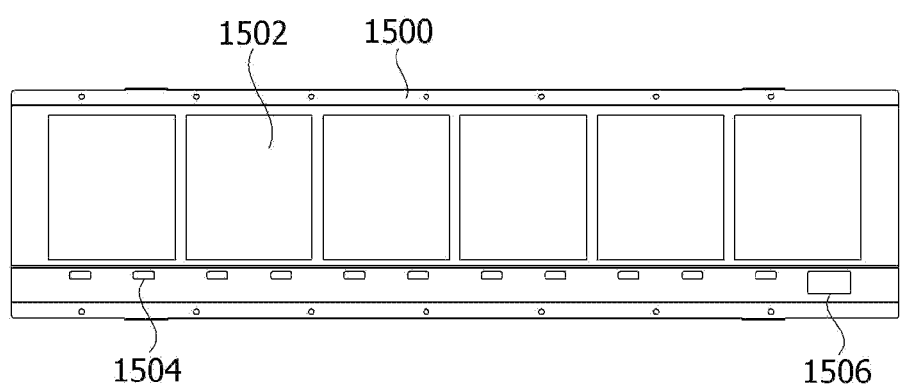

[FIG. 18]
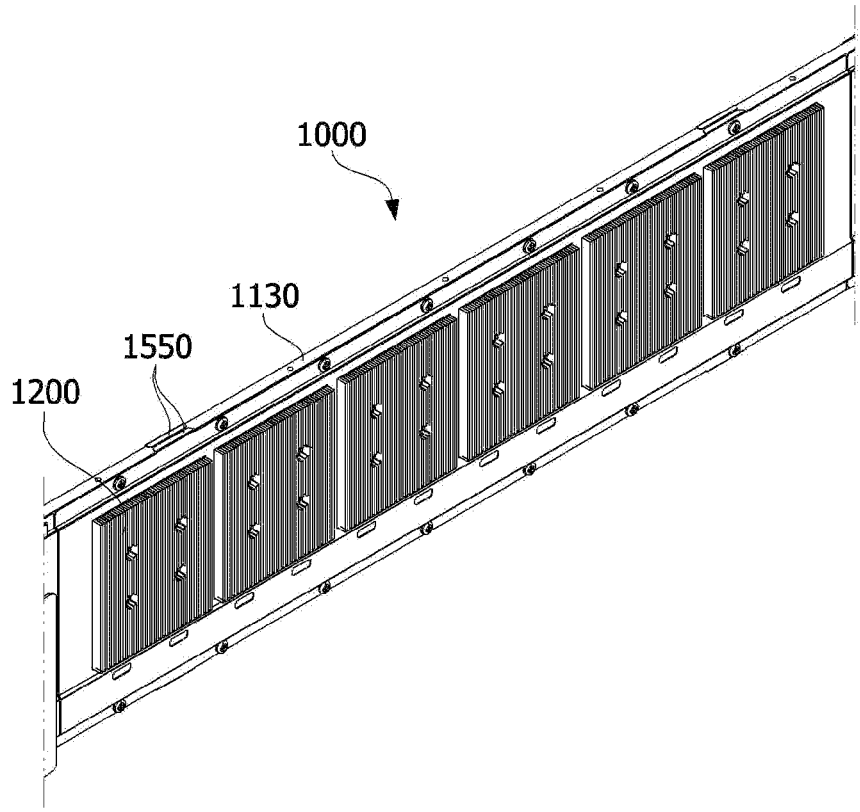
[FIG. 19]
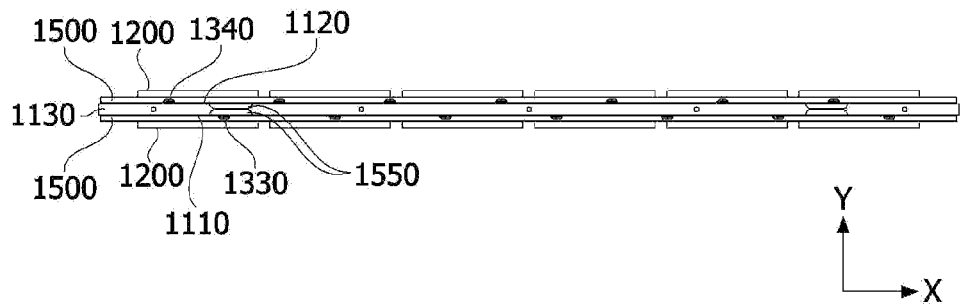

[FIG. 20]
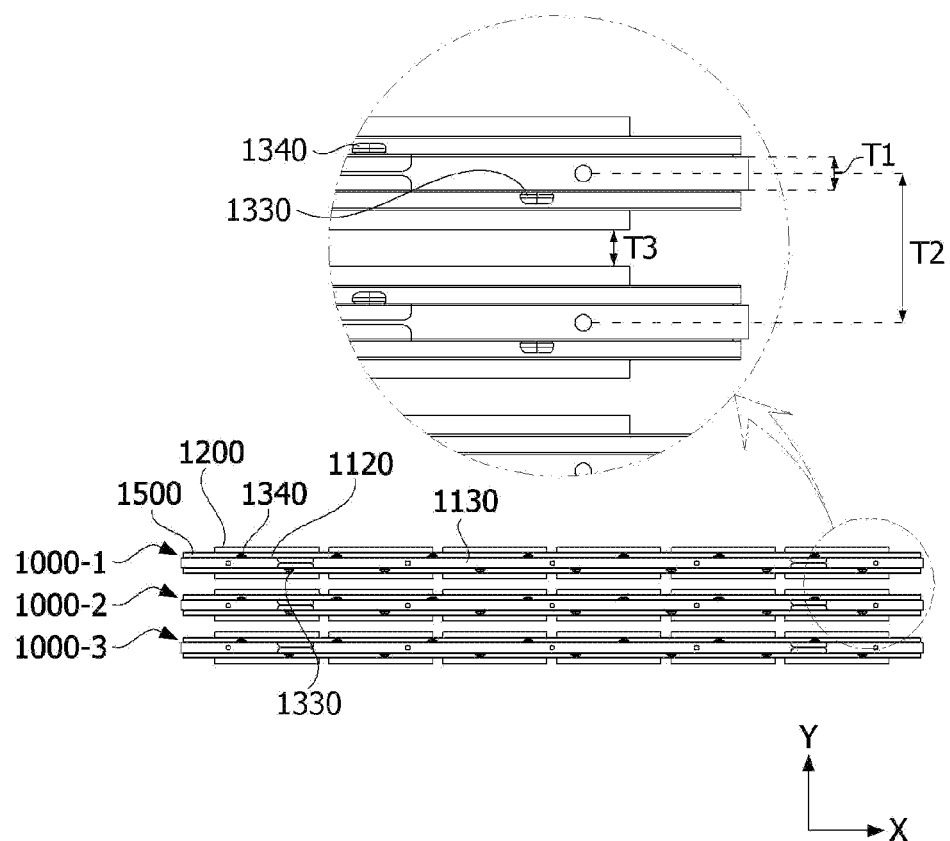

[FIG. 21]
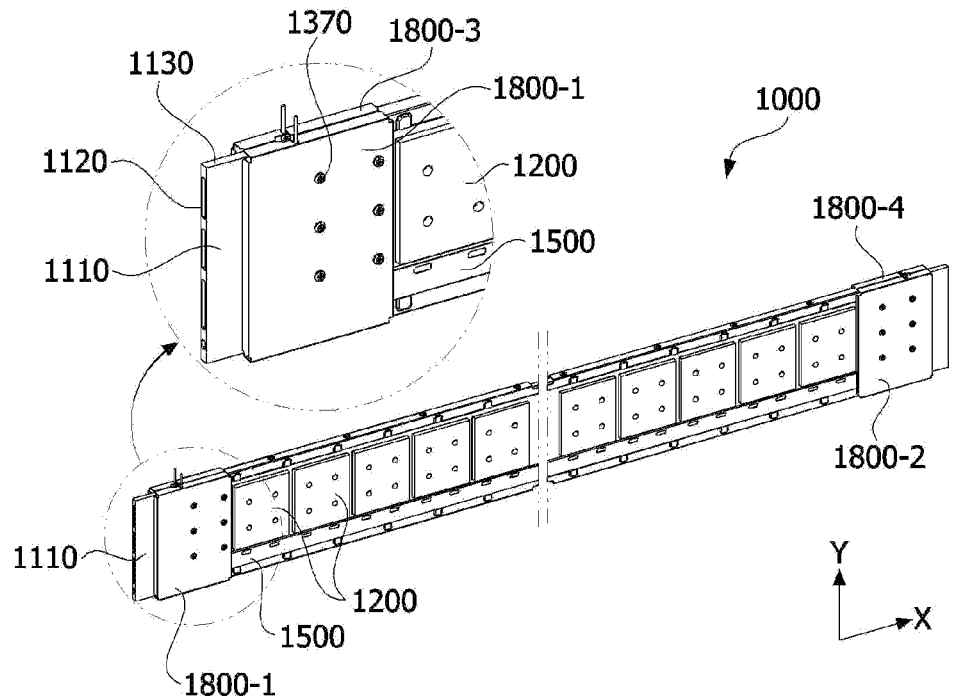
1800: 1800-1, 1800-2, 1800-3, 1800-4
[FIG. 22]
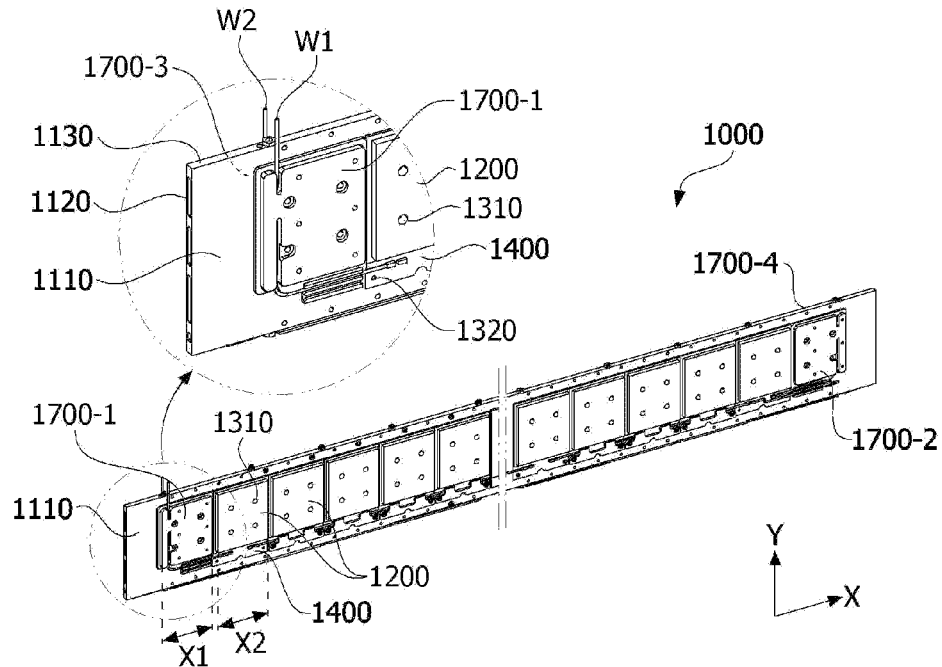
1700: 1700-1, 1700-2, 1700-3, 1700-4

[FIG. 23]
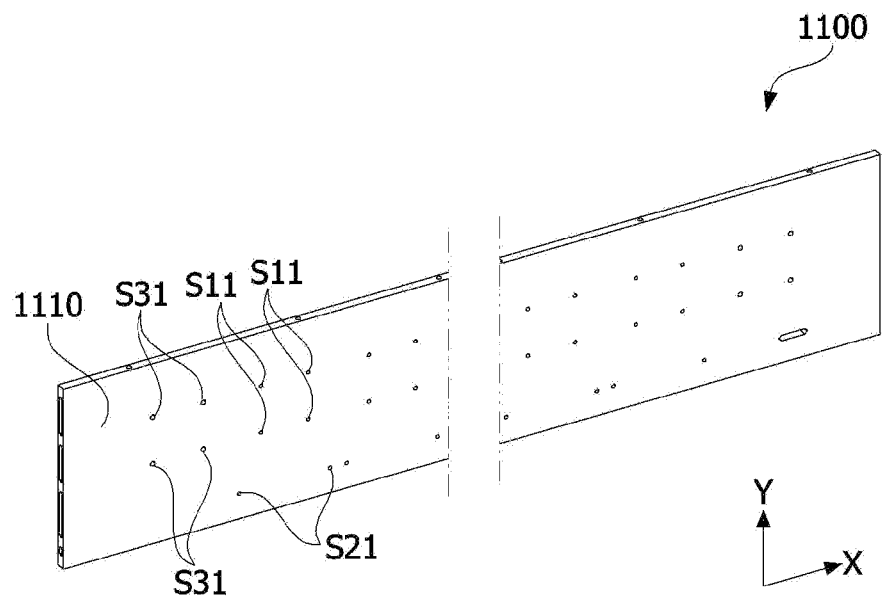

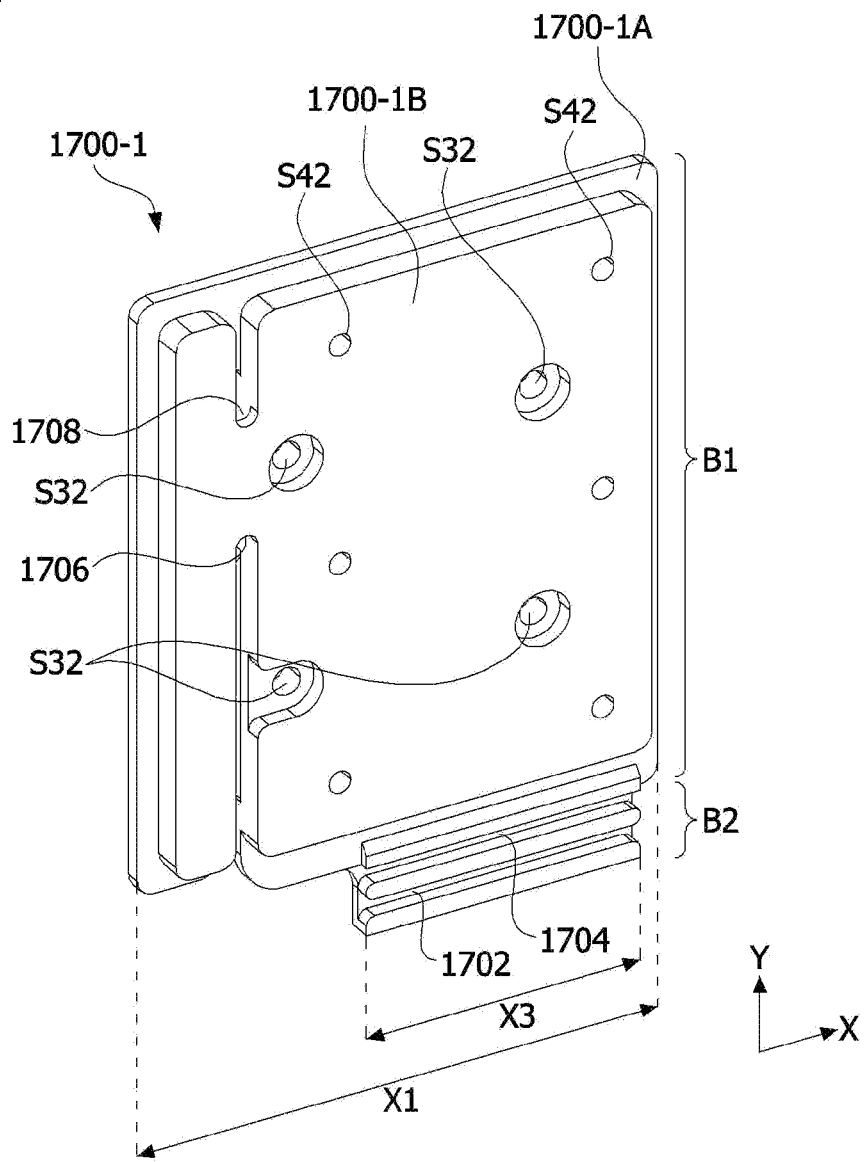
[FIG. 24]

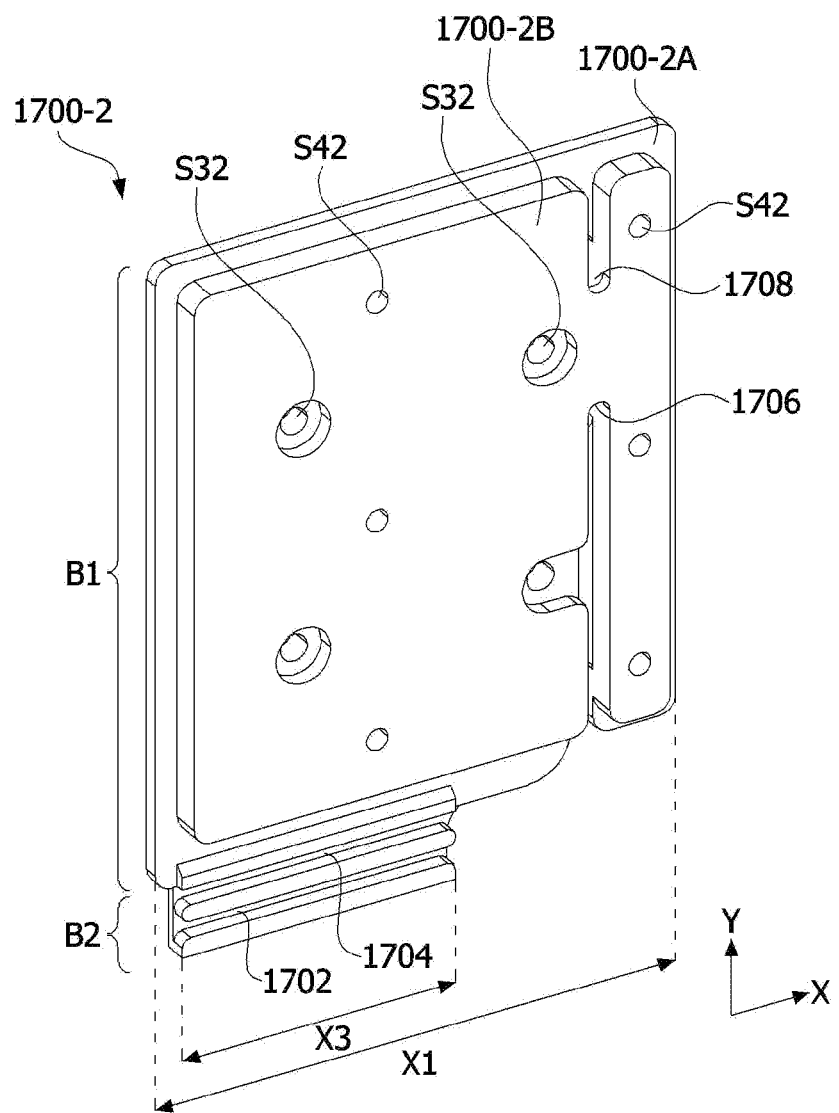
[FIG. 25]

[FIG. 26]
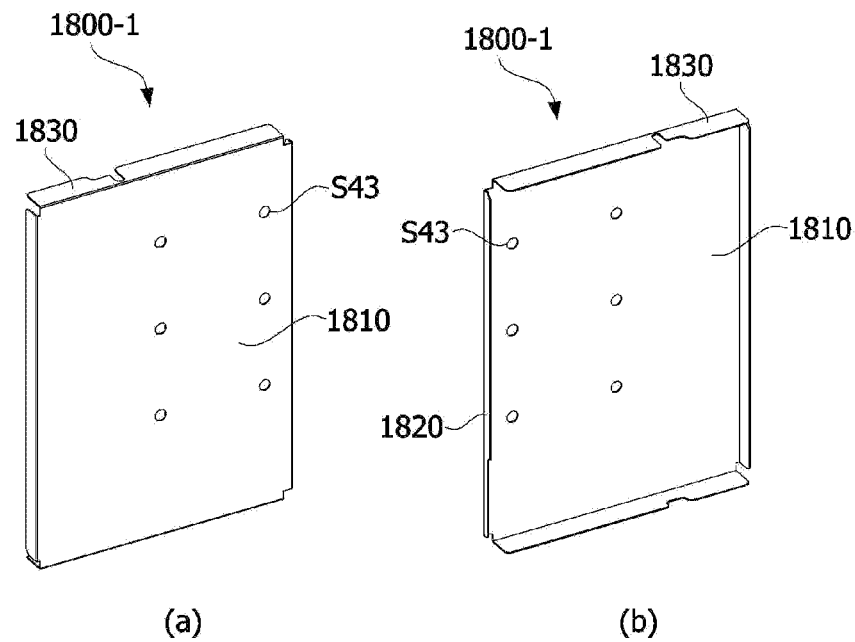
(a)          (b)
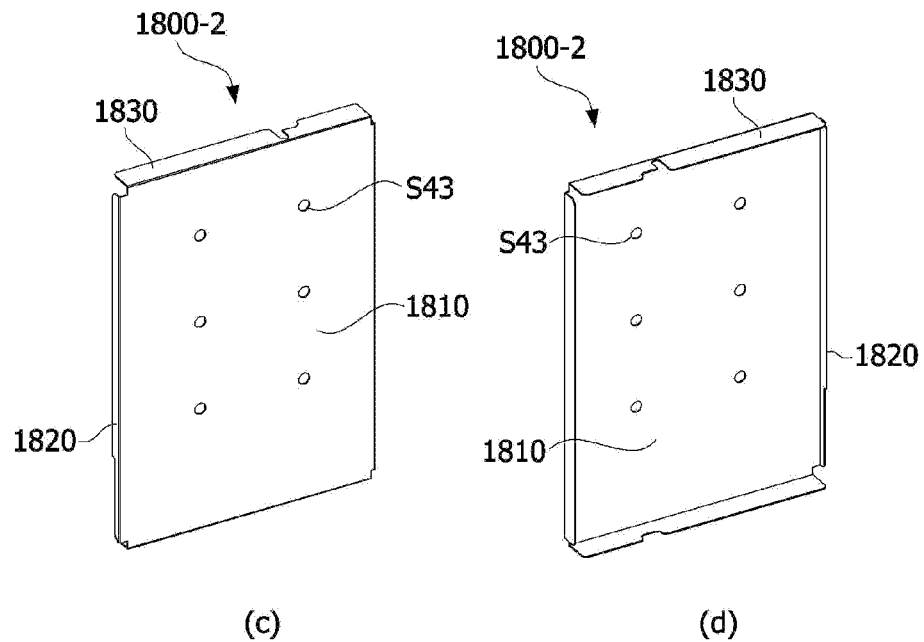
(c)          (d)

[FIG. 27]
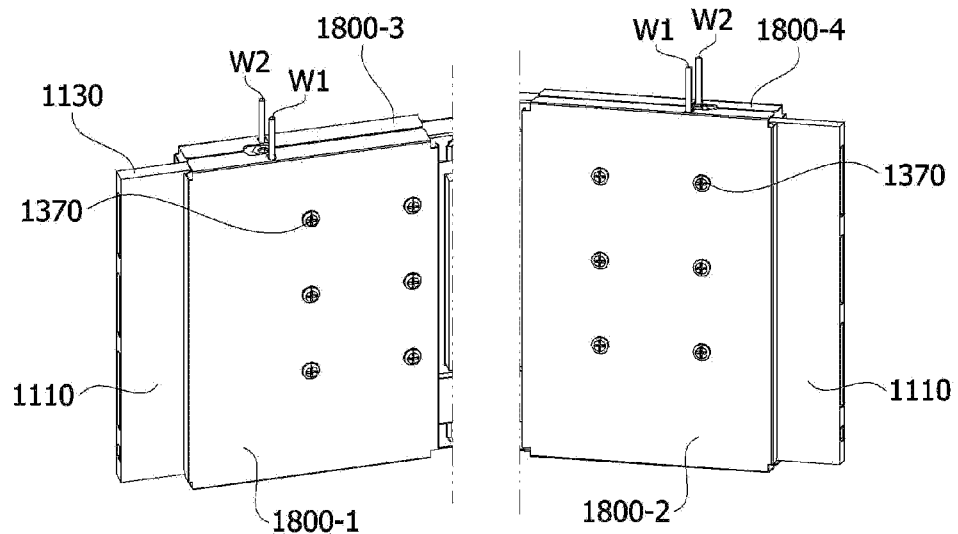
[FIG. 28]
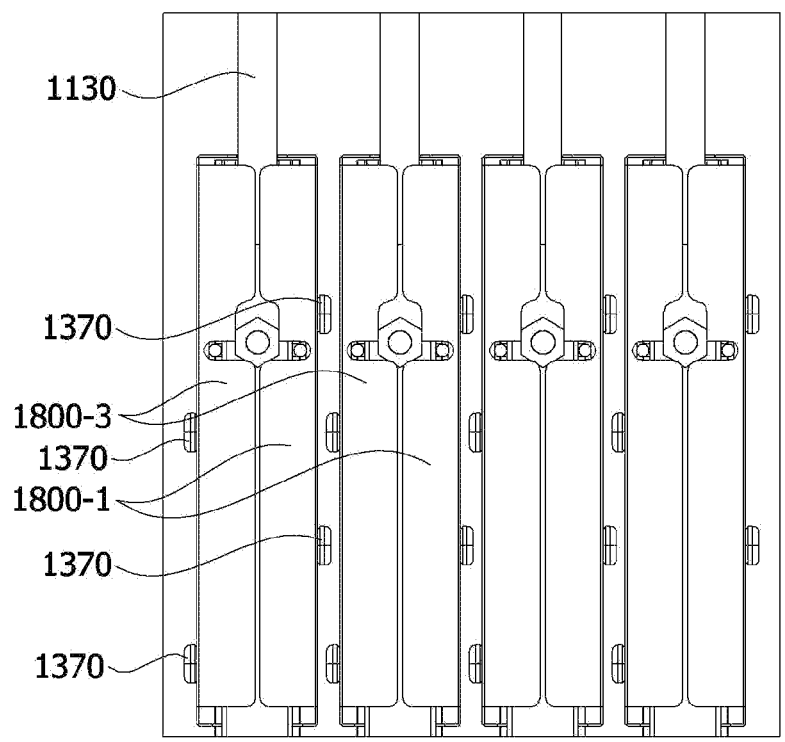

THERMOELECTRIC MODULE AND POWER GENERATION DEVICE INCLUDING SAME

CROSS-REFERENCE TO RELATED PATENT APPLICATIONS

This application is a U.S. National Stage Application under 35 U.S.C. § 371 of PCT Application No. PCT/KR2021/007547, filed Jun. 16, 2021, which claims priority to Korean Patent Application Nos. 10-2020-0074231 and 10-2020-0074232, both filed Jun. 18, 2020, whose entire disclosures are hereby incorporated by reference.

TECHNICAL FIELD

The present invention relates to a thermoelectric module and a power generation device including the same, and more specifically, to a thermoelectric module using a temperature difference between a low temperature part and a high temperature part of a thermoelectric element and a power generation device including the same or a Peltier device for cooling or heating a specific object such as a fluid.

BACKGROUND ART

A thermoelectric phenomenon is a phenomenon caused by the movement of electrons and holes inside a material and refers to direct energy conversion between heat and electricity.

A thermoelectric element is a generic term for an element using the thermoelectric phenomenon and has a structure in which a PN junction pair is formed by bonding a P-type thermoelectric material and an N-type thermoelectric material between metal electrodes.

Thermoelectric elements can be classified into elements using a change in electrical resistance according to temperature, elements using the Seebeck effect that is a phenomenon in which an electromotive force is generated by a temperature difference, elements using the Peltier effect that is a phenomenon in which heat absorption or heat generation occurs due to a current, and the like.

Thermoelectric elements are widely applied to home appliances, electronic components, communication components, and the like. For example, the thermoelectric elements can be applied to cooling devices, heating devices, power generation devices, and the like. Therefore, the demand for thermoelectric performance of the thermoelectric elements is gradually increasing.

Recently, there is a need to generate electricity using high-temperature waste heat generated from engines of automobiles, ships, and the like and the thermoelectric elements. In this case, a fluid flow part through which a first fluid passes is disposed on a low temperature part of the thermoelectric element, a heat sink is disposed on a high temperature part of the thermoelectric element, and a second fluid may pass the heat sink. Therefore, electricity can be generated by a temperature difference between the low temperature part and the high temperature part of the thermoelectric element.

Technical Problem

The present invention is directed to providing a thermoelectric module using a temperature difference between a low temperature part and a high temperature part of a thermoelectric element and a power generation device including the same or a Peltier device for cooling or heating a specific object such as a fluid.

Technical Solution

A thermoelectric device according to one embodiment of the present invention includes a fluid flow part including one surface and the other surface spaced apart from the one surface in a first direction, a first thermoelectric element disposed on the one surface of the fluid flow part, a second thermoelectric element disposed on the other surface of the fluid flow part, a first shield member disposed on the first thermoelectric element, and a second shield member disposed on the second thermoelectric element, wherein a first coupling hole to which a first coupling member is coupled is formed in the one surface of the fluid flow part and the first shield member, a second coupling hole to which a second coupling member is coupled is formed in the other surface of the fluid flow part and the second shield member, and the first coupling hole and the second coupling hole are disposed to be misaligned with each other in the first direction.

The thermoelectric device may further include a first heat sink disposed on the first thermoelectric element, wherein the first shield member may include a plurality of through holes, the plurality of through holes may include a first through hole, and the first heat sink may pass through the first through hole.

The thermoelectric device may further include a sealing member disposed between the first through hole and the first heat sink.

The thermoelectric device may further include a connector part disposed on one side of the first thermoelectric element and connected to the first thermoelectric element, wherein a second through hole, which is a portion of the plurality of through holes, may be disposed to perpendicularly overlap the connector part.

The thermoelectric device may further include a cover member disposed on a portion of an upper surface of the connector part, wherein a width of the second through hole may be greater than a width of the upper surface of the connector part.

An area of the second through hole may be smaller than an area of the first through hole.

The second through hole may be sealed by the sealing member.

The thermoelectric device may further include a sealing member disposed along at least a portion of an edge of the first shield member.

The first shield member may include a first shield part disposed on the one surface of the fluid flow part, a second shield part connected to the first shield part and including a region where the first through hole is formed, a third shield part connected to the second shield part and including a region where the second through hole is formed, and a fourth shield part connected to the third shield part and disposed on the fluid flow part, wherein a height of the second shield part may be disposed to be greater than heights of the first shield part and the fourth shield part, and a height of the third shield part may be disposed to be greater than the first shield part, the second shield part, and the fourth shield part with respect to the one surface of the fluid flow part.

The first shield member may further include a support part extending from the first shield part and disposed on a surface perpendicular to the one surface of the fluid flow part.

The support part may include a plurality of support regions disposed to be spaced apart from each other.

The first shield member may further include a protrusion disposed in the third shield part and protruding to at least partially overlap a region where a plurality of wires overlap.

The plurality of through holes may further include a third through hole formed to at least partially overlap the region where the plurality of wires overlap.

An area of the third through hole may be different from an area of the first through hole and an area of the second through hole.

A thermoelectric device according to another embodiment of the present invention includes a fluid flow part, a first guide member and a second guide member disposed to be spaced apart from each other on one surface of the fluid flow part, and a thermoelectric module disposed between the first guide member and the second guide member on the one surface of the fluid flow part, wherein a width of each of the first guide member and the second guide member in a first direction from the first guide member toward the second guide member is 0.9 to 1.1 times a width of the thermoelectric module.

The thermoelectric module may include a thermoelectric element, a heat sink disposed on the thermoelectric element, and a connector connected to the thermoelectric element.

Each of the first guide member and the second guide member may include a first region where a height from the one surface of the fluid flow part is 0.8 to 1 times a height from the one surface of the fluid flow part to an upper surface of the thermoelectric element and a second region disposed on a side surface of the first region and having a greater height from the one surface of the fluid flow part than the first region.

At least one of the first guide member and the second guide member may guide a wire connected to the thermoelectric module.

At least one of the first guide member and the second guide member may include a first guide region disposed on a side surface of the thermoelectric element and a second guide region protruding from the first guide region and disposed on a side surface of the connector, and a width of the first guide region in the first direction may be greater than a width of the second guide region in the first direction.

At least one groove extending in the first direction may be formed in the second guide region, and the wire connected to the connector may be guided in the first direction through the groove.

Two holes formed in a second direction perpendicular to the first direction may be formed in the first guide region, and the wire guided through the groove may be guided in the second direction through the two holes.

A plurality of 1-1 through holes may be formed in the first guide region, a plurality of 1-2 through holes corresponding to the plurality of 1-1 through holes may be formed in the fluid flow part, and the first guide region and the fluid flow part may be coupled by a coupling member passing through the plurality of 1-1 through holes and the plurality of 1-2 through holes.

The thermoelectric device may include the thermoelectric module, a first shield member disposed on the first guide member and the second guide member, a 2-1 shield member disposed on a portion of the first guide member and a portion of the first shield member, and a 2-2 shield member disposed on other portions of the second guide member and the first shield member.

At least one of the 2-1 shield member and the 2-2 shield member may include a first shield surface disposed on an upper surface of at least one of the first guide member and the second guide member and a second shield surface protruding from the first shield surface toward the one surface of the fluid flow part, and the second shield surface may be disposed between the side surface of at least one of the first guide member and the second guide member and the side surface of the thermoelectric element disposed adjacent to at least one of the first guide member and the second guide member.

The thermoelectric device may further include a heat insulating member disposed between at least one of the 2-1 shield member and the 2-2 shield member and the one surface of the fluid flow part.

The heat insulating member may be disposed on a side surface of the second shield surface.

The wire may be drawn out between at least one of the first guide member and the second guide member and at least one of the 2-1 shield member and the 2-2 shield member.

A region where the wire is drawn out between the at least one of the first guide member and the second guide member and the at least one of the 2-1 shield member and the 2-2 shield member may be sealed by a sealing member.

One or more through holes to which each of the first guide member and the second guide member is coupled may be formed in each of the 2-1 shield member and the 2-2 shield member, and at least one of the shape, number, and position of through holes of the 2-1 shield member may be different from at least one of the shape, number, and position of the through holes of the 2-2 shield member.

One or more through holes to which the fluid flow part or each of the 2-1 shield member and the 2-2 shield member is coupled may be formed in each of the first guide member and the second guide member, and at least one of the shape, number, and position of the through holes of the first guide member may be different from at least one of the shape, number, and position of the through holes of the second guide member.

Advantageous Effects

According to an embodiment of the present invention, it is possible to obtain a power generation device that not only has excellent power generation performance even but also is simply assembled.

In addition, according to an embodiment of the present invention, it is possible to arrange a large number of power generation devices per area, thereby increasing power generation efficiency per unit area.

In particular, according to an embodiment of the present invention, a process of arranging a shield member on a thermoelectric module can be simple, and the thermoelectric module can be protected from moisture, heat, or other contaminants.

In addition, according to an embodiment of the present invention, a wire connected to the thermoelectric module can be easily drawn out.

DESCRIPTION OF DRAWINGS

FIG. 1 is a perspective view of a power generation device according to one embodiment of the present invention.

FIG. 2 is an exploded perspective view of the power generation device according to one embodiment of the present invention.

FIGS. 3 and 4 are views of a thermoelectric element according to one embodiment of the present invention.

FIG. 5 is a top view of one surface of a fluid flow part included in the power generation device according to one embodiment of the present invention.

FIG. 6 is a perspective view of a thermoelectric module included in the power generation device according to one embodiment of the present invention.

FIG. 7 is a top view of a first board of the thermoelectric module included in the power generation device according to one embodiment of the present invention.

FIG. 8 is a top view in which a plurality of thermoelectric modules are disposed on one surface of the fluid flow part included in the power generation device according to one embodiment of the present invention.

FIG. 9 is a top view in which the plurality of thermoelectric modules and a plurality of cover members are disposed on the one surface of the fluid flow part included in the power generation device according to one embodiment of the present invention.

FIG. 10 is a top view in which the plurality of thermoelectric modules and the plurality of cover members are disposed on the one surface of the fluid flow part included in the power generation device according to one embodiment of the present invention, and the wire is connected to a connector.

FIG. 11 is a partially enlarged view of FIG. 10.

FIGS. 12 (a) and (b) shows the cover member included in the power generation device according to one embodiment of the present invention.

FIG. 13 is a top view in which the plurality of thermoelectric modules are disposed on the one surface of the fluid flow part included in the power generation device according to one embodiment of the present invention, the wire is connected to the connector, and then a shield member is disposed.

FIG. 14 is a perspective view of the shield member of FIG. 13.

FIG. 15 is a view showing a region where a sealing member is applied on the shield member of FIG. 14.

FIG. 16 is a cross-sectional view of the shield member of FIG. 14 along line A-A'.

FIG. 17 is a perspective view of a shield member according to another embodiment of the present invention.

FIG. 18 is a perspective view of a power generation device according to another embodiment of the present invention.

FIG. 19 is a top view of the power generation device according to another embodiment of the present invention.

FIG. 20 is an example in which a plurality of power generation devices according to another embodiment of the present invention are disposed.

FIG. 21 is a perspective view of a power generation device according to one embodiment of the present invention.

FIG. 22 is a perspective view of a state in which the shield member is removed from the power generation device of FIG. 21.

FIG. 23 is a perspective view of the fluid flow part included in the power generation device according to one embodiment of the present invention.

FIGS. 24 and 25 are perspective views of a guide member included in the power generation device according to one embodiment of the present invention.

FIG. 26 (a) to (d) are perspective views of a second shield member disposed on the guide member included in the power generation device according to one embodiment of the present invention.

FIG. 27 is a view showing a region where the second shield member is disposed in the power generation device according to one embodiment of the present invention.

FIG. 28 is a view showing a region where the second shield member is disposed when a plurality of power generation devices according to one embodiment of the present invention are disposed in parallel.

MODES OF THE INVENTION

Hereinafter, exemplary embodiments of the present invention will be described in detail with reference to the accompanying drawings.

However, the technical spirit of the present invention is not limited to some embodiments described but may be implemented in various different forms, and one or more of the components may be used by being selectively coupled or substituted between the embodiments without departing from the technical spirit scope of the present invention.

In addition, terms (including technical and scientific terms) used in the embodiments of the present invention may be construed as the meaning that may be generally understood by those skilled in the art to which the present invention pertains, unless specifically defined and described explicitly, and the meaning of generally used terms such as terms defined in the dictionary may be construed in consideration of the contextual meaning of the related art.

In addition, the terms used in the embodiments of the present invention are intended to describe the embodiments and are not intended to limit the present invention.

In this specification, the singular form may also include the plural form unless otherwise specified in the phrase, and when it is described as "at least one (or one or more) of A and B, C," it may include one or more of all possible combinations of A, B, and C.

In addition, in describing the components of the embodiment of the present invention, terms such as first, second, A, B, (a), and (b) may be used.

These terms are only intended to distinguish the component from other components, and the essence, sequence, or order of the corresponding components is not limited by the terms.

In addition, when it is described that a component is "connected," "coupled," or "joined" to another component, this may include a case in which the component is not only directly connected, coupled, or connected to another component, but also a case in which the component is "connected," "coupled," or "joined" to another component through other components interposed therebetween.

In addition, when it is described as being formed or disposed on "top (above) or bottom (below)" of each component, the top (above) or bottom (below) includes not only a case in which two components are in direct contact with each other but also a case in which one or more other components are formed or disposed between the two components. In addition, when expressed as "top (above) or bottom (below)," this may also include the meaning of not only an upward direction but also a downward direction with respect to one component.

FIG. 1 is a perspective view of a power generation device according to one embodiment of the present invention, and FIG. 2 is an exploded perspective view of the power generation device according to the embodiment of the present invention.

Referring to FIGS. 1 and 2, a power generation device 1000 includes a fluid flow part 1100 and a thermoelectric module 1200 disposed on a surface of the fluid flow part 1100. A plurality of power generation devices 1000 may be disposed in parallel to be spaced apart by a predetermined interval from each other to form a power generation system.

The power generation device 1000 according to the embodiment of the present invention may generate power using a temperature difference between a first fluid flowing through an inside of the fluid flow part 1100 and a second fluid passing through an outer side of the fluid flow part 1100.

The first fluid introduced into the fluid flow part 1100 may be water, but is not limited thereto, and may be various types of fluids having cooling performance. A temperature of the first fluid introduced into the fluid flow part 1100 may be lower than 100° C., preferably, lower than 50° C., and more preferably, lower than 40° C., but is not limited thereto, and may be a fluid having a lower temperature than the second fluid. A temperature of the first fluid discharged after passing through the fluid flow part 1100 may be higher than the temperature of the first fluid introduced into the fluid flow part 1100.

The first fluid is introduced from a fluid inlet of the fluid flow part 1100 and discharged through a fluid outlet. In order to facilitate the introduction and discharge of the first fluid and support the fluid flow part 1100, an inlet flange (not shown) and an outlet flange (not shown) may further be disposed on the fluid inlet and the fluid outlet of the fluid flow part 1100, respectively. Alternatively, a plurality of fluid inlets (not shown) may be formed on a first surface 1110 of the fluid flow part 1100, a second surface 1120 opposite to the first surface 1110, and a fifth surface 1150 disposed perpendicular to a third surface 1130 between the first surface 1110 and the second surface 1120, and a plurality of fluid outlets 1162 may be formed on a sixth surface 1160 opposite to the fifth surface 1150. The plurality of fluid inlets (not shown) and the plurality of fluid outlets 1162 may be connected to a plurality of fluid passage pipes (not shown) in the fluid flow part 1100. Therefore, the first fluid introduced into each fluid inlet may be discharged from each fluid outlet 1162 after passing through each fluid passage pipe.

However, this is illustrative, and the number, position, shape, and the like of the fluid inlet and the fluid outlet are not limited thereto. One fluid inlet, one fluid outlet, and the fluid passage pipe connecting the fluid inlet and the fluid outlet may also be formed in the fluid flow part 1100.

Meanwhile, the second fluid passes the outer side of the fluid flow part 1100, for example, a heat sink 1220 of the thermoelectric module 1200 disposed outside the fluid flow part 1100. The second fluid may refer to waste heat generated from engines such as automobiles and ships, but is not limited thereto. For example, a temperature of the second fluid may be 100° C. or higher, preferably, 200° C. or higher, and more preferably, 220° C. to 250° C., but is not limited thereto, and may be a fluid having a higher temperature than the first fluid.

In the specification, an example in which a temperature of the first fluid flowing through the inside of the fluid flow part 1100 is lower than the temperature of the second fluid passing the heat sink 1220 of the thermoelectric module 1200 disposed outside the fluid flow part 1100 will be described. Therefore, in the specification, the fluid flow part 1100 may be referred to as a duct or a cooling part. However, the embodiment of the present invention is not limited thereto, and the temperature of the first fluid flowing through the inside of the fluid flow part 1100 may also be higher than the temperature of the second fluid passing the heat sink 1220 of the thermoelectric module 1200 disposed outside the fluid flow part 1100.

According to the embodiment of the present invention, the thermoelectric module 1200 includes a thermoelectric element 1210 and the heat sink 1220 disposed on the thermoelectric element 1210. The thermoelectric element 1210 according to the embodiment of the present invention may have a structure of a thermoelectric element 100 shown in FIGS. 3 and 4.

Referring to FIGS. 3 and 4, the thermoelectric element 100 includes a first board 110, a first electrode 120, a P-type thermoelectric leg 130, an N-type thermoelectric leg 140, a second electrode 150, and a second board 160.

The first electrode 120 is disposed between the first board 110 and lower bottom surfaces of the P-type thermoelectric leg 130 and the N-type thermoelectric leg 140, and the second electrode 150 is disposed between the second board 160 and upper bottom surfaces of the P-type thermoelectric leg 130 and the N-type thermoelectric leg 140. Therefore, the plurality of P-type thermoelectric legs 130 and the plurality of N-type thermoelectric legs 140 are electrically connected by the first electrode 120 and the second electrode 150. A pair of P-type thermoelectric legs 130 and N-type thermoelectric legs 140 disposed between the first electrode 120 and the second electrode 150 and electrically connected may form a unit cell.

For example, when a voltage is applied to the first electrode 120 and the second electrode 150 through lead wires 181 and 182, a board through which a current flows from the P-type thermoelectric leg 130 to the N-type thermoelectric leg 140 due to the Peltier effect may absorb heat and function as a cooling part, and a board through which a current flows from the N-type thermoelectric leg 140 to the P-type thermoelectric leg 130 may be heated and may function as a heating part. Alternatively, when a temperature difference between the first electrode 120 and the second electrode 150 is applied, charges in the P-type thermoelectric leg 130 and the N-type thermoelectric leg 140 may move due to the Seebeck effect, and electricity may be generated.

Here, the P-type thermoelectric leg 130 and the N-type thermoelectric leg 140 may be bismuth telluride (Bi—Te)-based thermoelectric legs containing bismuth (Bi) and tellurium (Te) as main materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain 99 to 99.999 wt % of Bi—Sb—Te, which is a main raw material and contain 0.001 to 1 wt % of at least one of nickel (Ni), aluminum (Al), copper (Cu), silver (Ag), lead (Pb), boron (B), gallium (Ga), and indium (In) based on 100 wt % of the total weight. The N-type thermoelectric leg 140 may be a bismuth telluride (Bi—Te)-based thermoelectric leg containing at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain 99 to 99.999 wt % of Bi—Se—Te, which is a main raw material and contain 0.001 to 1 wt % of at least one of nickel (Ni), aluminum (Al), copper (Cu), silver (Ag), lead (Pb), boron (B), gallium (Ga), and indium (In) based on 100 wt % of the total weight.

The P-type thermoelectric leg 130 and the N-type thermoelectric leg 140 may be formed in a bulk type or a stacked type. In general, the bulk type P-type thermoelectric leg 130 or the bulk type N-type thermoelectric leg 140 may be obtained through a process of manufacturing an ingot by thermally processing a thermoelectric material, acquiring a powder for thermoelectric leg by grinding and sieving the ingot, and then sintering the powder for thermoelectric leg, and cutting a sintered body. In this case, the P-type thermoelectric leg 130 and the N-type thermoelectric leg 140 may be polycrystalline thermoelectric legs. As described above, when the P-type thermoelectric leg 130 and the N-type thermoelectric leg 140 are the polycrystalline thermoelectric legs, strengths of the P-type thermoelectric leg 130 and the N-type thermoelectric leg 140 may be increased. The stack type P-type thermoelectric leg 130 or the stack type N-type thermoelectric leg 140 may be obtained by applying a paste including a thermoelectric material to a sheet-shaped board to form a unit member and then stacking and cutting the unit member.

In this case, the pair of P-type thermoelectric legs 130 and N-type thermoelectric legs 140 may have the same shape and volume or different shapes and volumes. For example, since the electrical conduction characteristics of the P-type thermoelectric leg 130 and the N-type thermoelectric leg 140 are different, a height or cross-sectional area of the N-type thermoelectric leg 140 may also be formed differently from a height or cross-sectional area of the P-type thermoelectric leg 130.

In this case, the P-type thermoelectric leg 130 or the N-type thermoelectric leg 140 may have a cylindrical shape, a polygonal column shape, an elliptical column shape, or the like.

In the specification, the thermoelectric leg may also be referred to as a thermoelectric structure, a semiconductor device, a semiconductor structure, and the like.

The performance of the thermoelectric element according to one embodiment of the present invention may be represented by a figure of merit (ZT). The figure of merit (ZT) may be expressed as in Equation 1.

$$ZT = \alpha 2 \cdot \sigma \cdot T/k \qquad \text{[Equation 1]}$$

Here, α refers to a Seebeck coefficient [V/K], σ refers to an electrical conductivity [S/m], and $\alpha^2 \sigma$ refers to a power factor [W/mK$^2$]. In addition, T refers to a temperature and k refers to a thermal conductivity [W/mK]. k may be expressed as a·cp·ρ, where a refers to a thermal diffusivity [cm$^2$/S], cp refers to a specific heat [J/gK], and ρ refers to a density [g/cm$^3$].

In order to obtain the figure of merit of the thermoelectric element, a Z value (V/K) may be measured using a Z meter, and the figure of merit (ZT) may be calculated using the measured Z value.

Here, the first electrode 120 disposed between the first board 110 and the P-type thermoelectric leg 130 and the N-type thermoelectric leg 140 and the second electrode 150 disposed between the second board 160 and the P-type thermoelectric leg 130 and the N-type thermoelectric legs 140 may contain at least one of copper (Cu), silver (Ag), aluminum (Al), and nickel (Ni) and have a thickness in the range of 0.01 mm to 0.3 mm. When the first electrode 120 or the second electrode 150 has a thickness of smaller than 0.01 mm, the functionality of the electrode may be degraded, thereby reducing electrical conduction performance, and when the thickness exceeds 0.3 mm, conduction efficiency may be reduced due to an increase in resistance.

In addition, the first board 110 and the second board 160 opposite to each other may be metal boards, and the thicknesses thereof may be in the range of 0.1 mm to 1.5 mm. When the thickness of the metal board is smaller than 0.1 mm or greater than 1.5 mm, heat dissipation characteristics or thermal conductivity may be excessively increased, thereby reducing the reliability of the thermoelectric element. In addition, when the first board 110 and the second board 160 are the metal boards, an insulating layer 170 may be further formed between the first board 110 and the first electrode 120 and between the second board 160 and the second electrode 150. The insulating layer 170 may include a material having a thermal conductivity of 1 to 20 W/mK. In this case, the insulating layer 170 may be a layer consisting of a resin composition containing at least one of an epoxy resin and a silicone resin and an inorganic material or a silicone composition containing silicone and the inorganic material or an aluminum oxide layer. Here, the inorganic material may be at least one of oxides, nitrides, and carbides of aluminum, boron, silicon, and the like.

In this case, the first board 110 and the second board 160 may be formed to have different sizes. In other words, a volume, thickness, or area of one of the first board 110 and the second board 160 may be greater than those of the other. Here, the thickness may be a thickness from the first board 110 toward the second board 160, and the area may be an area in a direction perpendicular to a direction from the first board 110 toward the second board 160. Therefore, it is possible to enhance the heat the absorption performance or heat dissipation performance of the thermoelectric element. Preferably, the volume, thickness, or area of the first board 110 may be formed to be greater than at least one of the volume, thickness, and area of the second board 160. In this case, when the first board 110 is disposed in a high-temperature region for the Seebeck effect, when the first board 110 is applied as a heating region for the Peltier effect, or when a sealing member for protecting the thermoelectric element from the external environment, which will be described below, is disposed on the first board 110, at least one of the volume, thickness, and area of the first board 110 may be greater than those of the second board 160. In this case, the area of the first board 110 may be formed in the range of 1.2 to 5 times the area of the second board 160. When the area of the first board 110 is formed to be smaller than 1.2 times that of the second board 160, the influence on the improvement in heat transmission efficiency is not high, and when the area of the first board 110 exceeds 5 times, the heat transmission efficiency is significantly reduced, and it may be difficult to maintain a basic shape of the thermoelectric module.

In addition, a heat dissipation pattern, for example, an uneven pattern may also be formed on a surface of at least one of the first board 110 and the second board 160. Therefore, it is possible to enhance the heat dissipation performance of the thermoelectric element. When the uneven pattern is formed on a surface in contact with the P-type thermoelectric leg 130 or the N-type thermoelectric leg 140, it is also possible to improve the bonding characteristics between the thermoelectric legs and the board.

Although not shown, a sealing member may be further disposed between the first board 110 and the second board 160. The sealing member may be disposed on side surfaces of the first electrode 120, the P-type thermoelectric leg 130, the N-type thermoelectric leg 140, and the second electrode 150 between the first board 110 and the second board 160. Therefore, the first electrode 120, the P-type thermoelectric leg 130, the N-type thermoelectric leg 140, and the second electrode 150 may be sealed from external moisture, heat, contamination, and the like.

Referring back to FIGS. 1 and 2, the thermoelectric module 1200 according to the embodiment of the present invention includes the thermoelectric element 1210 and the heat sink 1220 disposed on the thermoelectric element 1210. FIGS. 1 and 2 show that two thermoelectric modules 1200-1 and 1200-2 may be disposed on the first surface 1110 of the fluid flow part 1100, and two thermoelectric modules 1200-3 and 1200-4 may also be disposed on the second surface 1120, but the present invention not limited thereto, and two or more thermoelectric modules may be disposed on one surface.

As described above, each thermoelectric element 1210 includes the first board 110 disposed to be in contact with the fluid flow part 1100, the plurality of first electrodes 120 disposed on the first board 110, the plurality of thermoelectric legs 130 and 140 disposed on the plurality of first electrodes 120, the plurality of second electrodes 150 disposed on the plurality of thermoelectric legs 130 and 140, and the second board 160 disposed on the plurality of second electrodes 150, and the heat sink 1220 is disposed on the second board 160. In addition, the insulating layer 170 may be further disposed between the first board 110 and the plurality of first electrodes 120 and between the plurality of second electrodes 150 and the second board 160.

In this case, the first board of the thermoelectric element 1210 disposed on the fluid flow part 1100 may be a metal board, and the metal board may be bonded to the surface of the fluid flow part 1100 by a thermal interface material (TIM) (not shown). Since the metal board has excellent heat transmission performance, heat transmission between the thermoelectric element and the fluid flow part 1100 is easy. In addition, when the metal board and the fluid flow part 1100 are bonded by the TIM, the heat transmission between the metal board and the fluid flow part 1100 may not be disturbed. Here, the metal board may be one of a copper board, an aluminum board, and a copper-aluminum board, but the present invention is not limited thereto.

As described above, according to the embodiment of the present invention, the plurality of thermoelectric modules 1200 are disposed on the surface of the fluid flow part 1100. Each of the plurality of thermoelectric modules 1200 may include a connector for applying electricity to extract generated electricity to the outside or use the generated electricity as a Peltier device. According to the embodiment of the present invention, a cover member 1400 may be disposed on the connector, thereby uniformly maintaining a bonding force between the thermoelectric module 1200 and the fluid flow part 1100 and protecting a conductive wire connected to the connector.

FIG. 5 is a top view of one surface of a fluid flow part included in the power generation device according to one embodiment of the present invention, FIG. 6 is a perspective view of a thermoelectric module included in the power generation device according to one embodiment of the present invention, and FIG. 7 is a top view of a first board of the thermoelectric module included in the power generation device according to one embodiment of the present invention. FIG. 8 is a top view in which a plurality of thermoelectric modules are disposed on one surface of the fluid flow part included in the power generation device according to one embodiment of the present invention, FIG. 9 is a top view in which the plurality of thermoelectric modules and a plurality of cover members are disposed on the one surface of the fluid flow part included in the power generation device according to one embodiment of the present invention, and FIG. 10 is a top view in which the plurality of thermoelectric modules and the plurality of cover members are disposed on the one surface of the fluid flow part included in the power generation device according to one embodiment of the present invention, and the wire is connected to a connector. FIG. 11 is a partially enlarged view of FIG. 10, and FIG. 12 shows the cover member included in the power generation device according to one embodiment of the present invention.

Referring to FIGS. 5 to 12, the thermoelectric module 1200 is disposed on the first surface 1110 of the fluid flow part 1100. Hereinafter, for convenience of description, only the thermoelectric module 1200 disposed on the first surface 1110 of the fluid flow part 1100 is described, but the present invention is not limited thereto, and the same structure may also be applied to the second surface 1120 that is a surface opposite to the first surface 1110. With regard to the fluid flow part 1100 and the thermoelectric module 1200, overlapping descriptions of the same contents as those described with reference to FIGS. 1 to 4 will be omitted.

According to the embodiment of the present invention, the first board 1212 of the thermoelectric module 1200 is disposed on the first surface 1110 of the fluid flow part 1100. In this case, the first board 1212 may be disposed to be in direct contact with the first surface 1110 of the fluid flow part 1100 or disposed to be in indirect contact with the first surface 1110 through the TIM or the like. The first board 1212 may be the first board 110 described with reference to FIGS. 1 to 4. Therefore, with regard to the first board 1212, overlapping descriptions of the same contents as those of the first board 110 described with reference to FIGS. 1 to 4 will be omitted.

As shown in FIGS. 6 and 7, the first board 1212 of the thermoelectric module 1200 may include a first region A1 and a second region A2. In this case, the plurality of first electrodes, the plurality of thermoelectric legs, the plurality of second electrodes, the second board, and the heat sink 1220 are disposed in the first region A1, and connector part 210 and 220 connected to the first electrode may be disposed in the second region A2 that is one side of the first region A1. Here, the plurality of first electrodes, the plurality of thermoelectric legs, the plurality of second electrodes, and the second board may be the plurality of first electrodes 120, the plurality of thermoelectric legs 130 and 140, the plurality of second electrodes 150, and the second board 160 described with reference to FIGS. 1 to 4.

According to the embodiment of the present invention, the fluid flow part 1100 and the thermoelectric module 1200 may be coupled by a coupling member 1300. To this end, a plurality of 1-1 through holes S11 may be formed in the first surface 1110 of the fluid flow part 1100, and a plurality of 1-2 through holes S12 corresponding to the plurality of 1-1 through holes S11 may also be formed in the first region A1 of the first board 1212 of the thermoelectric module 1200. In addition, a plurality of 1-3 through holes S13 corresponding to the plurality of 1-1 through-holes 511 and the plurality of 1-2 through-holes S12 may also be formed in the second board (not shown) and the heat sink 1220 of the thermoelectric module 1200. Therefore, as shown in FIGS. 8 to 11, a plurality of first coupling members 1310 may be coupled to the plurality of 1-1 through holes S11, the plurality of 1-2 through holes S12, and the plurality of 1-3 through holes S13, and thus the fluid flow part 1100 and the thermoelectric module 1200 may be coupled.

Meanwhile, according to the embodiment of the present invention, a plurality of 2-1 through holes S21 may be further formed in the first surface 1110 of the fluid flow part 1100, and a plurality of 2-2 through-holes S22 corresponding to the plurality of 2-1 through-holes S21 may be further formed in the second region A2 of the first board 1212 of the thermoelectric module 1200. In addition, a cover member 1400 may be further disposed in the second region A2 of the first board 1212, and as shown in FIG. 12, a plurality of 2-3 through holes S23 corresponding to the plurality of 2-1 through holes S21 and the plurality of 2-2 through holes S22 may be formed in the cover member 1400. A plurality of second coupling members 1320 may be coupled to the plurality of 2-1 through holes S21, the plurality of 2-2 through holes S22, and the plurality of 2-3 through holes S23, and thus the fluid flow part 1100, the thermoelectric module 1200, and the cover member 1400 may be coupled.

Therefore, since not only the first region A1 but also the second region A2 of the first board 1212 of the thermoelectric module 1200 may also be coupled to the fluid flow part 1100, the entire first board 1212 of the thermoelectric module 1200 may uniformly have a bonding force with the fluid flow part 1100, and heat may be evenly distributed over the entire first board 1212.

In particular, as shown in FIG. 11, when the first board 1212 of the thermoelectric module 1200 and the fluid flow part 1100 are coupled using the cover member 1400, a coupling torque of the second coupling member 1320 may be increased by applying the cover member 1400. Therefore, since the second coupling member 1320 is less likely to be released even under vibration conditions, the thermoelectric module 1200 may be more firmly attached to the fluid flow part 1100.

In this case, a width D of the cover member 1400 may be substantially the same as a width D' of the first board 1212 on which the cover member 1400 is disposed. For example, the width D of the cover member 1400 may be 0.9 to 1 times, preferably, 0.925 to 1 times, and more preferably, 0.95 to 1 times the width D' of the first board 1212 on which the cover member 1400 is disposed. Therefore, the cover member 1400 can press the entire width D' of the first board 1212, thereby preventing the first board 1212 from being deformed or separated.

More specifically, the plurality of 2-3 through holes S23 may be formed in both sides of the cover member 1400, thereby uniformly supporting both sides of the second region A2 of the first board 1212 in a balanced manner and preventing the thermal deformation of the first board 1212. In this case, a distance d3 between two 2-3 through holes S23 in one cover member 1400 may be greater than a distance d4 between two 1-3 through holes S13 in one heat sink 1220. Therefore, the cover member 1400 can uniformly support both sides of the second region A2 of the first board 1212 in a balanced manner.

Meanwhile, as shown in FIG. 12, the plurality of 2-3 through holes S23 formed in both sides of the cover member 1400 may be a shape having a step inner wall. In other words, a diameter d1 of the 2-3 through holes S23 in a first surface 1402 of both surfaces of the cover member 1400 disposed to face the first board 1212 may be smaller than a diameter d2 of the 2-3 through hole S23 in a second surface 1404, which is a surface opposite to the first surface 1402, and a step 1406 may be formed on the inner wall of the 2-3 through hole S23. Therefore, a head of the second coupling member 1320 may be disposed on the step 1406 formed on the inner wall of the 2-3 through hole S23.

Here, the cover member 1400 may include an insulating material, for example, a plastic material. Therefore, since the head of the second coupling member 1320 is in contact with the cover member 1400, it is possible to insulate the first board 1212 including metal and the head of the second coupling member 1320 and improve the withstand voltage performance of the thermoelectric module 1200.

In addition, when the cover member 1400 includes the plastic material, the cover member 1400 may be easily molded into various sizes and shapes. More specifically, the cover member 1400 may be a plastic material applicable at high temperature, such as polyphenylene sulfide (PPS). Therefore, it is possible to prevent a problem that a shape of the cover member 1400 is deformed by the high-temperature second fluid.

As described above, since the cover member 1400 and the first board 1212 are coupled by the coupling member 1320 passing through the plurality of 2-3 through holes S23, a region including the plurality of 2-3 through holes S23 may be referred to as a coupling part 1400A. The coupling part 1400A includes a first side surface 1410 closest to one side of the thermoelectric element 1210 and a second side surface 1420 opposite to the first side surface 1410. The second side surface 1420 of the cover member 1400 may be disposed along an edge E1 (shown in FIG. 7) of the first board 1212. Here, the edge E1 of the first board 1212 among four edges of the first board 1212 may be disposed in the second region A2 and may be an edge in a direction parallel to the direction in which the plurality of connector part 210 and 220 are disposed. As described above, when the second side surface 1420 of the cover member 1400 is disposed along the edge E1 of the first board 1212, the cover member 1400 presses the edge E1 of the first board 1212, and thus it is possible to prevent a problem that the edge of the thermoelectric module 1200 is lifted from the fluid flow part 1100. In this case, a first groove 1412, which is concave toward a second side surface 1420, may be formed in a first side surface 1410 of the cover member 1400, and a second groove 1422, which is concave toward the first side surface 1410, may be formed in a second side surface 1420. As described above, when all grooves are formed in both the first side surface 1410 and the second side surface 1420 of the cover member 1400, thermal stress is applied to both side surfaces of the cover member 1400 in a balanced manner, and thus it is possible to prevent the distortion of the cover member 1400 due to the imbalance of the thermal stress. In this case, a width B1 of the first groove 1412 is greater than a width B2 of the second groove 1422. For example, the width B1 of the first groove 1412 may be 1.5 to 3 times the width B2 of the second groove 1422. As described above, when the width B1 of the first groove 1412 is greater than the width B2 of the second groove 1422, wires W1 and W2 may be easily connected to the connector part 210 and 220. In addition, when the width B1 of the first groove 1412 disposed close to the connector part 210 and 220 is greater than the width B2 of the second groove 1422, heat generated from the connector part 210 and 220 may be efficiently discharged through the first groove 1412, and the stiffness of the cover member 1400 may be maintained through the second side surface 1420. In addition, when the width of the second groove 1422 disposed close to the edge E1 of the first board 1212 is smaller than the width of the first groove 1412, since a contact area between the cover member 1400 and the edge E1 of the first board 1212 is increased on the edge E1 of the first board 1212, a force of the cover member 1400 pressing the edge E1 of the first board 1212 is large, and thus a bonding force between the edge E1 of the first board 1212 of the thermoelectric module 1200 and the fluid flow part 1100 may be increased, and the edge E1 of the first board 1212 of the thermoelectric module 1200 can be prevented from being lifted.

Specifically, the cover member 1400 may be disposed on at least a portion of the connector part 210 and 220. As described above, when the connector part 210 and 220 include the first connector 210 and the second connector 220 disposed to be spaced apart from each other, at least a portion of the first connector 210 and the second connector 220 may be disposed in the first groove 1412. Therefore, one end or the other end of the first connector 210 exposed by the first groove 1412 and one end or the other end of the second connector 220 exposed by the first groove 1412 may be easily connected to the wires W1 and W2. In other words, since the cover member 1400 may be fixed to the first board 1212 of the thermoelectric module 1200 and the wires W1 and W2 may be connected, the wires W1 and W2 may be replaced or a connection path of the wires W1 and W2 may be changed.

In this case, since the connector part 210 and 220 include the first connector 210 and the second connector 220 disposed to be spaced apart from each other at the same distance h2 from the edge E1 of the first board 1212, the cover member 1400 may include a first cover region 1430 disposed on at least a portion of the first connector 210 and a second cover region 1432 disposed on at least a portion of the second connector 220, and the first groove 1412 may be disposed between the first cover region 1430 and the second cover region 1432.

In this case, as shown in FIG. 11, distal ends of the first connector 210 and the second connector 220 may be disposed to be exposed from side surfaces of the first cover region 1430 and the second cover region 1432. For example, a width C1 of each of the first cover region 1430 and the second cover region 1432 may be 0.8 to 0.95 times, preferably, 0.85 to 0.9 times a width C2 of each of the first connector 210 and the second connector 220. Therefore, each of the first cover region 1430 and the second cover region 1432 can protect each of the first connector 210 and the second connector 220 from external heat or the like, and the wires W1 and W2 may also be easily connected. However, when the wires W1 and W2 are easily connected, the width C1 of each of the first cover region 1430 and the second cover region 1432 may be 0.8 to 1.1 times the width C2 of each of the first connector 210 and the second connector 220. Therefore, the first cover region 1430 and the second cover region 1432 can protect each of the first connector 210 and the second connector 220 from external heat or the like, and it is also possible to more effectively prevent damage to the torsion due to a temperature difference applied to and/or occurring in the thermoelectric module.

In this case, a surface of both surfaces of the first cover region 1430 and the second cover region 1432 disposed to face the connectors 210 and 220 may be disposed to be spaced apart from the connectors 210 and 220. Therefore, the connectors 210 and 220 can be protected from external physical pressure, moisture, second fluid, or contaminants by the first and second cover regions 1430 and 1432, and the first and second cover regions 1430 and 1432 can block the contact possibility between the connectors 210 and 220 and the shield member made of the metal material, thereby increasing the withstand voltage of the thermoelectric module 1200.

Meanwhile, a distal end of each of the first cover region 1430 and the second cover region 1432 may be bent toward the first board 1212. In other words, the cover member 1400 may further include a first guide region 1440 and a second guide region 1442 protruding from the first cover region 1430 and the second cover region 1432 toward the first board 1212. The first guide region 1440 may be disposed on a side surface of the first connector 210, and the second guide region 1442 may be disposed on a side surface of the second connector 220. Therefore, it is possible to prevent the wires W1 and W2 connected to the first and second connectors 210 and 220 from being pushed up toward an electrode of the thermoelectric element or from being separated. In this case, the first and second guide regions 1440 and 1442 may be in contact with the first board 1212. Therefore, since pressure may be applied to the first board 1212 by the first and second guide regions 1440 and 1442, a bonding force between the first board 1212 and the fluid flow part 1100 may be increased. As described above, the first cover region 1430 may be connected to the first guide region 1440, and the second cover region 1432 may be connected to the second guide region 1442. In this case, each of the first cover region 1430 and the second cover region 1432 may support each of the first guide region 1440 and the second guide region 1442. When the width C1 of each of the first cover region 1430 and the second cover region 1432 is within a predetermined range, for example, 0.85 times or more the width C2 of each of the first connector 210 and the second connector 220, the cover member 1400 may have high stiffness capable of supporting each of the first guide region 1440 and the second guide region 1442.

In addition, according to the embodiment of the present invention, in the coupling part 1400A of the cover member 1400, the first surface 1402 of both surfaces of the coupling part 1400A disposed to face the first board 1212 may be in contact with the first board 1212, and a plurality of recesses R may be formed in the first surface 1402 at regular intervals. Therefore, it is easy to injection-mold the cover member 1400, and it is possible to prevent the distortion due to thermal deformation and press the first board 1212 uniformly with respect to the entire area of the cover member 1400 even while reducing the amount of material for molding the cover member 1400 and a weight of the cover member 1400.

Meanwhile, according to the embodiment of the present invention, the second groove 1422 of the cover member 1400 may include a curved surface having a predetermined curvature, a third groove G may be formed in the edge E1 of the first board 1212, and the second groove 1422 and the third groove G may be disposed to correspond to each other. In other words, the second groove 1422 and the third groove G may have the same size and shape and may be aligned on the same position on the first surface 1110 of the fluid flow part 1100. Therefore, when the cover member 1400 is disposed after the thermoelectric module 1200 is disposed on the fluid flow part 1100, it is easy to guide the position of the cover member 1400.

In addition, it is possible to relieve the thermal stress of the first board 1212 by the second groove 1422 of the cover member 1400 and the third groove G formed on the edge E1 of the first board 1212, thereby reducing the thermal deformation of the first board 1212 and thus increasing the bonding force between the first board 1212 and the fluid flow part 1100.

In particular, at least one of the second groove 1422 and the third groove G may have a smooth curved shape having a predetermined curvature. As described above, it is possible to prevent a problem that thermal stress is concentrated on a corner portion, thereby further enhancing the thermal stress relieving performance of the first board 1212.

Here, the second groove 1422 may be formed between the plurality of 2-3 through holes S23 formed in both sides of the cover member 1400, and the third groove G may be formed between the first connector 210 and the second connector 220 disposed in the second region A2 of the first board 1212. In this case, a depth h1 of the third groove G may be smaller than a distance h2 from the edge E1 of the first board 1212 to the connectors 210 and 220. Therefore, it is possible to maintain the bonding force between the first board 1212 and the fluid flow part 1100 and enhance the withstand voltage performance of the thermoelectric module 1200.

As shown in FIGS. 5 to 12, the plurality of thermoelectric modules 1200 are disposed on the fluid flow part 1100, the cover member 1400 is disposed on the connector part 210 and 220, the plurality of thermoelectric modules 1200, the cover member 1400, and the fluid flow part 1100 are coupled using the coupling member 1300, and then the plurality of thermoelectric modules 1200 are connected to the wires W1 and W2. Thereafter, a shield member 1500 is further disposed to prevent moisture or contaminants from permeating into the plurality of thermoelectric modules 1200.

FIG. 13 is a top view in which the plurality of thermoelectric modules are disposed on the one surface of the fluid flow part included in the power generation device according to the embodiment of the present invention, the wire is connected to the connector, and then a shield member is disposed, FIG. 14 is a perspective view of the shield member of FIG. 12, FIG. 15 is a view showing a region where a sealing member is applied on the shield member of FIG. 14, FIG. 16 is a cross-sectional view of the shield member of FIG. 14 along line A-A', and FIG. 17 is a perspective view of a shield member according to another embodiment of the present invention.

As described with reference to FIGS. 5 to 12, the thermoelectric element 1210 is disposed on the one surface 1110 of the fluid flow part 1100, and the heat sink 1220 is disposed on the thermoelectric element 1210. As described above, the thermoelectric element 1210 includes the first board 110 disposed on the one surface 1110 of the fluid flow part 1100, the first electrode 120 disposed on the first board 110, the semiconductor elements 130 and 140 disposed on the first electrode 120, the second electrode 150 disposed on the semiconductor elements 130 and 140, and the second board 160 disposed on the second electrode 150, and the heat sink 1220 may be disposed on the second board 160.

Referring to FIGS. 13 to 17, the shield member 1500 is disposed on the thermoelectric element 1210. In this case, in order for the second fluid to pass the heat sink 1220, a first through hole 1502 may be formed in the shield member 1500, an edge of the first through hole 1502 may be disposed in the second board of the thermoelectric element 1210, and the heat sink 1220 may be exposed through the first through hole 1502. In other words, the edge of the first through hole 1502 may be disposed on the second board of the thermoelectric element 1210, and the heat sink 1220 may pass through the first through hole 1502. Therefore, since the second fluid may directly pass the heat sink 1220 even while the inside of the thermoelectric element 1210 can be protected from external contaminants, moisture, and the second fluid, it is possible to efficiently exchange heat between the second fluid and the heat sink 1220. In this case, the edge of the first through hole 1502 may be disposed on the second board of the thermoelectric element 1210, and a size of the first through hole 1502 may be smaller than a size of the second board of the thermoelectric element 1210 and greater than a size of the heat sink 1220, that is, a size of a surface on which the heat sink 1220 is disposed on the second board so that the heat sink 1220 may pass through the first through hole 1502.

Meanwhile, as shown, the plurality of thermoelectric elements 1210 may be disposed on the one surface 1110 of the fluid flow part 1100, and the heat sink 1220 may be disposed on each thermoelectric element 1210. To this end, a plurality of first through holes 1502 may be formed in the shield member 1500, the edge of each first through hole 1502 may be disposed on the second board of each thermoelectric element 1210, and each heat sink 1220 may pass through each first through hole 1502. Therefore, since the plurality of thermoelectric elements 1210 may be covered using one shield member 1500, it is possible to simplify the process and structure of assembling the shield member 1500.

Meanwhile, as shown in FIG. 15, a sealing member 1600 may be disposed on the second board along the edge of the first through hole 1502 formed in the shield member 1500. In other words, the sealing member 1600 may be disposed between the first through hole 1502 and the heat sink 1220. In addition, a sealing member 1610 may be further disposed along at least a portion of the edge of the shield member 1500. Here, the sealing members 1600 and 1610 may be sealing materials or sealing tapes containing heat-resistant silicone. Therefore, it is possible to prevent moisture, the second fluid, or contaminants from permeating into the thermoelectric element 1210.

According to the embodiment of the present invention, a plurality of second through holes 1504 may be further formed in the shield member 1500. In this case, at least a portion of the plurality of second through holes 1504 may be disposed to perpendicularly overlap a region where the connectors 210 and 220 are disposed in the second region A2 of the first board 1212 of each thermoelectric element 1210. Here, verticality may refer to a direction parallel to a direction from the first board 110 to the second board 160 of each thermoelectric element 1210. Therefore, since the shield member 1500 made of a metal material is not disposed on at least a portion of the connectors 210 and 220, it is possible to enhance the withstand voltage characteristics of the thermoelectric element 1210. In this case, the plurality of second through holes 1504 may be sealed by a sealing member 1620.

More specifically, referring to FIG. 13, one 1504-1 of the plurality of second through holes 1504 may be formed to perpendicularly overlap the first connector 210, and the other 1504-2 thereof may be formed to perpendicularly overlap the second connector 220. In the enlarged view of FIG. 13, a portion of the cover member 1400 needs to be actually shown through the second through holes 1504-1 and 1504-2 of the shield member 1500, but for better understanding, all of the connectors 210 and 220 and the cover member 1400 disposed under the shield member 1500 are shown. In this case, a width C3 of each second through hole 1504 may be greater than the width C2 of the first connector 210 or the second connector 220. Therefore, the edge of each second through hole 1504 may be disposed not to perpendicularly overlap the first connector 210 or the second connector 220, and thus since the shield member 1500 made of the metal material is not disposed on the first connector 210 or the second connector 220, it is possible to enhance the withstand voltage characteristics of the thermoelectric element 1210, and the heat generated from the first connector 210 or the second connector 220 is not transmitted through the shield member 1500 and may be discharged to the outside through the second through holes 1504-1 and 1504-2.

In this case, as described above with reference to FIGS. 11 and 12, the cover member 1400 may be disposed on upper surfaces of the connector parts 210 and 220. In other words, according to the embodiment of the present invention, the cover member 1400 may be disposed on the upper surfaces of the first connector 210 and the second connector 220 for one thermoelectric element 1210, and the shield member 1500 may be disposed on the thermoelectric element 1210 and the cover member 1400, and the second through holes 1504-1 and 1504-2 of the shield member 1500 may be disposed in each of the upper surface of the first connector 210 and the upper surface of the second connector 220 on which the cover member 1400 is disposed. In other words, the first cover region 1430 of the cover member 1400 may be disposed on the first connector 210, and the second cover region 1432 of the cover member 1400 may be disposed on the second connector 220, and the first cover region 1430 and the second cover region 1432 may be disposed to perpendicularly overlap the second through holes 1504-1 and 1504-2 of the shield member 1500. Therefore, the first cover region 1430 and the second cover region 1432 may not only physically protect the first connector 210 and the second connector 220, but also provide the stiffness to the first guide region 1440 and the second guide region 1442 for preventing the separation of the wires connected to the first connector 210 and the second connector 220. Here, an area of each of the second through holes 1504 may be smaller than an area of each of the first through holes 1502. Therefore, it is easy to fill the second through hole 1504 with the sealing member 1620, and it is possible to prevent moisture, the second fluid, or contaminants from permeating into the second through hole 1504.

Meanwhile, according to the embodiment of the present invention, the shield member 1500 may be formed to have a step. In other words, the shield member 1500 may include a first shield region 1510 disposed on the one surface 1110 of the fluid flow part 1100, a second shield region 1520 connected to the first shield region 1510 and including a region where the first through hole 1502 is formed, a third shield region 1530 connected to the second shield region 1520 and including a region where the plurality of second through holes 1504 are formed, and a fourth shield region 1540 connected to the third shield region 1503 and disposed on the one surface 1110 of the fluid flow part 1100. In this case, the first shield region 1510 and the fourth shield region 1540 may be disposed on the one surface 1110 of the fluid flow part 1100, the second shield region 1520 may be disposed on the second board of the thermoelectric element 1210, and the third shield region 1530 may be disposed on the connectors 210 and 220. Therefore, with respect to the one surface 1110 of the fluid flow part 1100, a height of the second shield region 1520 may be disposed to be greater than heights of the first shield region 1510 and the fourth shield region 1540. In addition, since the heights of the connectors 210 and 220 are greater than the height of the second board of the thermoelectric element 1210, the third shield region 1530 may be disposed at a higher level than the first shield region 1510, the second shield region 1520, and the fourth shield region 1540. Therefore, the shield member 1500 can protect the fluid flow part 1100 and the thermoelectric element 1210 while minimizing the flow resistance of the second fluid.

In addition, the shield member 1500 may further include a support region 1550 extending from the first shield region 1510 and disposed on the surface 1130 perpendicular to the one surface 1110 of the fluid flow part 1100. Therefore, since the shield member 1500 may be disposed on the fluid flow part 1100 in a "]" shape, it is possible to prevent the position of the shield member 1500 from being disposed to be misaligned on the one surface 1110 of the fluid flow part 1100, and assembling is easy. In this case, the support region 1550 may also include a plurality of support regions disposed to be spaced apart from each other. Therefore, it is possible to reduce the material cost for constituting the shield member 1500 and reduce the weight of the shield member 1500.

Meanwhile, as shown in FIG. 17, according to the embodiment of the present invention, a third through hole 1506 may be further formed in the shield member 1500. In this case, at least a portion of the third through hole 1506 may be formed to overlap a region where the plurality of wires W1 and W2 overlap in the third shield region 1530 of the shield member 1500. For example, the wires W1 and W2 connected to the plurality of thermoelectric modules 1200 may be drawn out to the outside. Alternatively, the plurality of thermoelectric modules 1200 disposed on both surfaces of the fluid flow part 1100 may be connected to each other in parallel or in series by the wires W1 and W2. In this case, a guide member (not shown) may be disposed on one end or the other end of the fluid flow part 1100 to guide the wires W1 and W2, and the plurality of wires W1 and W2 may be guided through the guide member. In this case, the region in which the plurality of wires W1 and W2 overlap may occur in a narrow space. In order to prevent a problem that the height of the entire shield member 1500 needs to be increased due to the overlapping of the plurality of wires W1 and W2, the third through hole 1506 may be formed to partially overlap the region where the plurality of wires W1 and W2 overlap. Therefore, it is possible to prevent a problem that at least one of the plurality of wires W1 and W2 needs to bypass due to the shield member 1500. In this case, the third through hole 1506 may be filled with a sealing member (not shown). Therefore, it is possible to prevent a problem that moisture, the second fluid, or contaminants permeates into the third through hole 1506. To this end, an area of the third through hole 1506 may be smaller than an area of one of the plurality of first through holes 1502 and greater than an area of one of the plurality of second through holes 1504. In other words, since the first through hole 1502 is a through hole through which the heat sink 1220 passes, the first through hole 1502 has the greatest size among the first to third through holes, and it is preferable that the first through hole 1502 is formed to be greater than the second through hole 1504 because the third through hole 1506 is disposed in the region where the wires overlap.

Alternatively, although not shown, a protrusion may also be formed to at least partially overlap the region where the plurality of wires W1 and W2 overlap in the third shield region 1530 of the shield member 1500. Therefore, it is possible to prevent the problem that at least one of the plurality of wires W1 and W2 needs to bypass due to the shield member 1500, prevent the problem that the height of the entire shield member 1500 is increased due to the plurality of wires W1 and W2 overlapping each other, and reduce a sealing process using a separate sealing member as compared to a case in which the third through hole 1506 is formed.

As described above, when the third through hole 1506 or the protrusion is formed in the region where the plurality of wires overlap, it is possible to prevent the problem that the height of the entire shield member 1500 is increased, thereby minimizing the problem that the flow resistance of the second fluid is generated by the shield member 1500.

In FIGS. 13 to 17, an example in which the plurality of thermoelectric modules 1200 and one shield member 1500 are disposed on the one surface 1110 of the fluid flow part 1100 is described, but the present invention is not limited thereto, and the plurality of thermoelectric modules 1200 and the shield member 1500 may also be disposed to be symmetrical to the one surface 1110 of the fluid flow part 1100 and another surface 1120 opposite to the one surface 1110.

FIG. 18 is a perspective view of a power generation device according to another embodiment of the present invention, FIG. 19 is a top view of the power generation device according to another embodiment of the present invention, and FIG. 20 is an example in which a plurality of power generation devices according to another embodiment of the present invention are disposed.

Referring to FIGS. 18 and 19, the plurality of thermoelectric modules 1200 and the shield member 1500 may be disposed to be symmetrical to the one surface 1110 of the fluid flow part 1100 and another surface 1120 spaced apart from the one surface 1110 of the fluid flow part 1100 in a Y direction. With regard to the components of the plurality of thermoelectric modules 1200 and the shield member 1500, overlapping descriptions of the same contents as those described with reference to FIGS. 11 to 15 will be omitted.

The shield member 1500 disposed on the one surface 1110 of the fluid flow part 1100 may be coupled to the one surface 1110 of the fluid flow part 1100 by a plurality of coupling members 1330, and the shield member 1500 disposed on another surface 1120 of the fluid flow part 1100 may be coupled to another surface 1120 of the fluid flow part 1100 by a plurality of coupling members 1340. To this end, a plurality of holes to which the plurality of coupling members 1330 are coupled may be formed in the one surface 1110 of the fluid flow part 1100 and the shield member 1500, and a plurality of holes to which the plurality of coupling member 1340 are coupled may be formed in another surface 1120 of the fluid flow part 1100 and the shield member 1500. In this case, positions of the plurality of coupling members 1330 may be disposed to be misaligned with positions of the plurality of coupling members 1340 in the Y direction. In other words, the plurality of holes to which the plurality of coupling members 1330 are coupled formed in the one surface 1110 of the fluid flow part 1100 and the shield member 1500 and the plurality of holes to which the plurality of coupling members 1340 are coupled formed in another surface 1120 of the fluid flow part 1100 and the shield member 1500 may be disposed to be misaligned with each other in the Y direction. Here, when the plurality of holes are disposed to be misaligned with each other in the Y direction, it may mean that extension lines of the plurality of coupling members 1330 in the Y direction and extension lines of the plurality of coupling members 1340 in the Y direction are not misaligned with each other. When the plurality of holes are disposed to be misaligned with each other in the Y direction, it may mean that the plurality of coupling members 1330 and the plurality of coupling members 1340 are disposed to be spaced apart from each other in an X direction. Therefore, since the coupling member 1330 and the coupling member 1340 do not meet each other in the fluid flow part 1100, it is possible to implement the thickness of the fluid flow part 1100 as small as only one of the coupling member 1330 and the coupling member 1340 may be coupled. In other words, when the coupling member 1330 coupled to the one surface 1110 of the fluid flow part 1100 is disposed to be misaligned with the coupling member 1340 coupled to another surface 1120 of the fluid flow part 1100, the coupling member 1330 and the coupling member 1340 do not meet each other in the fluid flow part 1100, and thus the thickness of the fluid flow part 1100 in the Y direction may be implemented to be longer than a length of one of the coupling member 1330 and the coupling member 1340 and shorter than a length obtained by summing the length of the coupling member 1330 and the length of the coupling member 1340.

Therefore, as shown in FIG. 20, a plurality of power generation devices 1000-1, 1000-2, and 1000-3 may be densely disposed in a predetermined space. In other words, as the thickness of the fluid flow part 1100 in the Y direction is reduced, the number of power generation devices that may be disposed in a predetermined distance in the Y direction may increase. As the number of power generation devices that may be disposed in the predetermined distance increases, the amount of power generated per unit area or unit volume may be increased. For example, as in the embodiment of the present invention, when the positions of the plurality of coupling members 1330 and the positions of the plurality of coupling members 1340 are disposed to be misaligned with each other in the Y direction, a thickness T1 of the fluid flow part 1100 in the Y direction may be at least 8 mm, preferably, 8 mm to 20 mm, more preferably, 8 mm to 15 mm, and more preferably, 8 mm to 12 mm. Therefore, the fluid flow part 1100 included in the power generation device 1000-1 and the fluid flow part 1100 included in the neighboring power generation device 1000-2 may be disposed every minimum distance T2 of 28 mm, preferably, 28 mm to 40 mm, more preferably, 28 mm to 35 mm, and more preferably, 28 mm to 32 mm, and a distance T3 between one end of the power generation device 1000-1 and one end of the neighboring power generation device 1000-2 may be greater than or equal to 1 mm. As described above, when the plurality of power generation devices 1000-1, 1000-2, and 1000-3 are densely disposed in a predetermined space, the amount of power generation in the predetermined space may be increased.

In addition, when the positions of the plurality of coupling members 1330 are disposed to be misaligned with the positions of the plurality of coupling members 1340 in the Y-direction, the length of each of the coupling members 1330 and 1340 may be implemented to be longer than ½ of the thickness of the fluid flow part 1100. Therefore, a coupling force and reliability between the coupling members 1330 and 1340 and the fluid flow part 1100 can be increased.

Although the single thermoelectric module 1200 and the cover member 1400 disposed on the fluid flow part 1100 have been mainly described above, as shown in FIGS. 8 to 10, the plurality of thermoelectric modules 1200 may be disposed on one surface of the fluid flow part 1100, and the cover member 1400 may be disposed for each thermoelectric module 1200.

Throughout the specification, although it has been described that the thermoelectric elements 100 and 1210 include the first board 110, the first electrode 120, the P-type thermoelectric leg 130, the N-type thermoelectric leg 140, the second electrode 150, and the second board 160, the definition of the thermoelectric elements 100 and 1210 is not limited thereto, and this may also mean that the thermoelectric elements 100 and 1210 include the first electrode 120, the P-type thermoelectric leg 130, the N-type thermoelectric leg 140, the second electrode 150, and the second board 160 and are disposed on the first board 110.

In addition, throughout the specification, it has been described that the power generation device 1000 includes the fluid flow part 1100, the thermoelectric module 1200, the cover member 1400, and the shield member 1500 and the thermoelectric module 1200 includes the thermoelectric element 1210 and the heat sink 1220, but the present invention is not limited thereto, and this may also mean that the thermoelectric module includes all of the fluid flow part

1100, the thermoelectric element 1210, the heat sink 1220, the cover member 1400, and the shield member 1500.

In the specification, the width may refer to a width in a direction in which the plurality of thermoelectric modules are arrayed, that is, in the X direction shown in FIGS. 19 and 20. For example, the width D of the cover member 1400, the width D' of the first board 1212, the width B1 of the first groove 1412, and the width B2 of the second groove 1422, the width C1 of each of the first cover region 1430 and the second cover region 1432, and the width C2 of each of the first connector 210 and the second connector 220 may refer to the width in the direction in which the plurality of thermoelectric modules are arranged, that is, in the X direction shown in FIGS. 19 and 20.

Meanwhile, as described above, according to the embodiment of the present invention, the plurality of thermoelectric modules 1200 are disposed on the surface of the fluid flow part 1100. According to the embodiment of the present invention, the wires connected to the plurality of thermoelectric modules 1200 are guided using the guide member 1700.

FIG. 21 is a perspective view of a power generation device according to one embodiment of the present invention, and FIG. 22 is a perspective view of a state in which the shield member is removed from the power generation device of FIG. 21. FIG. 23 is a perspective view of the fluid flow part included in the power generation device according to one embodiment of the present invention. FIGS. 24 and 25 are perspective views of a guide member included in the power generation device according to one embodiment of the present invention, and FIG. 26 is a perspective view of a second shield member disposed on the guide member included in the power generation device according to one embodiment of the present invention. FIG. 27 is a view showing a region where the second shield member is disposed in the power generation device according to one embodiment of the present invention, and FIG. 28 is a view showing a region where the second shield member is disposed when a plurality of power generation devices according to one embodiment of the present invention are disposed in parallel.

Referring to FIGS. 21 to 28, a pair of guide members 1700-1 and 1700-2 are disposed to be spaced apart from each other on the first surface 1110 of the fluid flow part 1100, and the plurality of thermoelectric modules 1200 are disposed between the pair of guide members 1700-1 and 1700-2. A pair of guide members 1700-3 and 1700-4 are also disposed on the second surface 1120 opposite to the first surface 1110 of the fluid flow part 1100, and the plurality of thermoelectric modules 1200 are disposed between the pair of guide members 1700-3 and 1700-4. The first guide member 1700-1 and the third guide member 1700-3 are disposed opposite to each other with the fluid flow part 1100 therebetween, and the second guide member 1700-2 and the fourth guide member 1700-4 are disposed opposite to each other with the fluid flow part 1100 interposed therebetween.

With regard to the fluid flow part 1100 and the thermoelectric module 1200, overlapping descriptions of the same contents as those described above will be omitted.

According to the embodiment of the present invention, the first shield member 1500 is disposed on the plurality of thermoelectric elements 1210 disposed on the one surface 1110 of the fluid flow part 1100 and protects the plurality of thermoelectric elements 1210 from external moisture, contaminants, the second fluid, and the like. However, when the first shield member 1500 is manufactured to be disposed on the plurality of thermoelectric elements 1210, there is a case in which an empty space is generated between the first shield member 1500 and the fluid flow part 1100 according to the number of thermoelectric elements 1210. For example, when the number of thermoelectric elements 1210 disposed on the one surface of the fluid flow part 1100 is 16 and six first through holes 1502 are included so that the first shield member 1500 may be disposed on the six thermoelectric elements 1210, a total of three first shield members 1500 is required to shield all of the thermoelectric elements 1210, but the thermoelectric element 1210 may not be disposed in a space corresponding to two thermoelectric elements 1210, and the space remains as an empty space. When the empty space is formed in the side surface of the thermoelectric element 1210, there is a possibility that moisture, contaminants, or the second fluid may permeate therein, and thus the performance of the thermoelectric module can be degraded.

According to the embodiment of the present invention, the guide member 1700 is intended to be disposed on the side surface of the thermoelectric element 1210 to reduce the empty space. Here, the guide member 1700 may mean a structure having a size and shape similar to those of the thermoelectric element 1210 but not functioning as the thermoelectric element. Therefore, in the specification, the guide member may also be referred to as a dummy module, a dummy member, or a guide module.

According to the embodiment of the present invention, the guide member 1700 is disposed on the side surfaces of the plurality of thermoelectric modules 1200. When the direction in which the plurality of thermoelectric modules 1200 are disposed is referred to as the X direction, the guide member 1700 may be disposed in the X direction with respect to the plurality of thermoelectric modules 1200. In this case, a width X1 of the guide member 1700 in the X direction may be 0.9 to 1.1 times, preferably, 0.92 to 1.08 times, more preferably, 0.94 to 1.06 times, and more preferably, the same as a width X2 of each thermoelectric module 1200, and a height from the one surface 1110 of the fluid flow part 1100 to an upper surface of the guide member 1700 may be 0.8 to 1 times, preferably, 0.9 to 1 times, more preferably, 0.95 to 1 times, and more preferably, the same as a height from the one surface 1110 of the fluid flow part 1100 to the upper surface of the second board of each thermoelectric module 1200. Therefore, since a guide member having a size similar to that of the thermoelectric module may be disposed on the fluid flow part 1100, the process of assembling the thermoelectric module 1200 and the guide member 1700 on the fluid flow part 1100 is easy, it is not necessary to differ processes of manufacturing the fluid flow part 1100 on which the guide member 1700 is disposed and the fluid flow part 1100 on which the guide member 1700 is not disposed, and the assembling may be performed using the same first shield member 1500. In addition, it is possible to minimize the empty space in the side surface of the thermoelectric module 1200 on the fluid flow part 1100, thereby reducing the possibility of the permeation of moisture or the second fluid into the empty space.

In particular, as shown in FIGS. 24 and 25, the guide member 1700 may have a step structure. In other words, the guide members 1700-1 and 1700-2 may include first regions 1700-1A and 1700-2A and second regions 1700-1B and 1700-2B. The first regions 1700-1A and 1700-2A are regions disposed on edges, and the second regions 1700-1B and 1700-2B are regions surrounded by the first regions 1700-1A and 1700-2A, and the second regions 1700-1B and 1700-2B may be formed to be thicker than the first regions 1700-1A and 1700-2A. For example, when the guide members 1700-1 and 1700-2 are disposed on the one surface of the fluid flow part 1100, a height from the one surface of the fluid flow part 1100 to upper surfaces of the first region 1700-1A and 1700-2A may be 0.8 to 1 times, preferably, 0.9 to 1 times, more preferably, 0.95 to 1 times, and more preferably, the same as a height from the one surface of the fluid flow part 1100 to the upper surface of the second board of the thermoelectric element 1210, and a height from the one surface of the fluid flow part 1100 to upper surfaces of the second regions 17009-1B and 1700-2B may be greater than the height from the one surface of the fluid flow part 1100 to the upper surfaces of the first regions 1700-1A and 1700-2A. Therefore, the edge of the first through hole 1502 of the first shield member 1500 may be disposed in the first regions 1700-1A and 1700-2A of the guide members 1700-1 and 1700-2 like the thermoelectric element 1210, and the second regions 17009-1B and 1700-2B may pass through the first through hole 1502 of the first shield member 1500 like the heat sink 1220. Therefore, it is possible to minimize the empty space between the fluid flow part 1100 and the first shield member 1500 in the side surface of the thermoelectric element 1210.

Meanwhile, according to the embodiment of the present invention, it is possible to guide the wires connected to the connectors using the guide member.

More specifically, referring to FIG. 24, which is a perspective view of the first guide member 1700-1 disposed on one side of the first surface 1110 of the fluid flow part 1100 and FIG. 25, which is a perspective view of the second guide member 1700-2 disposed on the other side of the first surface 1110 of the fluid flow part 1100, at least one groove 1702 extending in the first direction may be formed in each guide member 1700, and the wires connected to the connectors 210 and 220 may be guided in the X direction through the groove 1702. To this end, like the first board 1212, the guide member 1700 may include a first guide region B1 disposed on the side surface of the first region A1 of the first board 1212 and a second guide region B2 disposed on the side surface of the second region A2 of the first board 1212 and protruding from the first guide region B1. In addition, the groove 1702 may be formed in the second guide region B2. Therefore, a wire W connected to the connectors 210 and 220 disposed in the second region A2 of the first board 1212 may be fixedly accommodated in the groove 1702 in the X direction.

In addition, a plurality of grooves 1702 and 1704 may also be formed in the second guide region B2 of the guide member 1700. In other words, another groove 1704 adjacent to one groove 1702 and extending to be parallel to the groove 1702 may be further formed. As described above, when the plurality of grooves 1702 and 1704 are formed in the second guide region B2, one of the plurality of grooves 1702 and 1704 may be selectively used according to the positions of the connectors 210 and 220.

Meanwhile, according to the embodiment of the present invention, two holes 1706 and 1708 may also be formed in the first guide region B1 of each guide member 1700 in the Y direction perpendicular to the X direction. The wire W connected to the connectors 210 and 220 and guided through the groove 1702 may be guided in the second direction through the two holes 1706 and 1708 and then drawn out to the outside. For example, the wire W may be guided from an upper surface of the first guide region B1 to a lower surface of the first guide region B1 through one hole 1706 and then guided back to the upper surface of the first guide region B1 by passing through another hole 1708. Therefore, the wire W may be fixed by the guide member 1700, and it is possible to minimize the possibility that the wire W is separated even in a frequent vibration environment. To this end, a width X3 of the second guide region B2 in the first direction may be smaller than a width X1 of the first guide region B1 in the X direction, the second guide region B2 may be disposed closer to one side of both sides of the first guide region B1 in the X direction, and the two holes 1706 and 1708 may be disposed closer to the other side of both sides of the first guide region B1 in the X direction. Therefore, the wire guided through the first groove 1702 in the X direction easily passes through the two holes 1706 and 1708 in the Y direction after bent vertically.

In this case, the one side of both sides of the first guide region B1 in the X direction may be a portion disposed adjacent to the thermoelectric element 1210, and the other side of both sides of the first guide region B1 in the X direction may be a portion disposed to face the edge of the fluid flow part 1100. Therefore, the positions of the grooves 1702 and the holes 1706 and 1708 formed in the first guide member 1700-1 and the second guide member 1700-2 disposed on both edges of the fluid flow part 11009 may be different from each other.

According to the embodiment of the present invention, the guide member 1700 may be coupled to the fluid flow part 1100 using a coupling member. To this end, a plurality of through holes S31 may be formed in the fluid flow part 1100, a plurality of through holes S32 corresponding to the plurality of through holes S31 may be formed in the first guide region B1 of the guide member 1700, and the guide member 1700 and the fluid flow part 1100 may be coupled by a coupling member 1360 passing through the plurality of through holes S31 and the plurality of through holes S32. In this case, since a head of the coupling member 1360 may be disposed in the plurality of through holes S32, inner wall surfaces of the plurality of through holes S32 may have a step structure. In addition, a virtual line connecting the plurality of through holes S32 may form a predetermined polygon. For example, the virtual line connecting the plurality of through holes S32 may form a rectangle or a square. Therefore, a bonding force may be distributed throughout the first guide region B1.

Meanwhile, according to the embodiment of the present invention, a second shield member 1800 may be disposed on the guide member 1700. Therefore, it is possible to prevent the wire W guided along the guide member 1700 from being exposed to moisture, the second fluid, or contaminants. As shown in FIGS. 21 and 22, the second shield member 1800 disposed on each of the first to fourth guide members 1700-1, 1700-2, 1700-3, and 1700-4 may be referred to as 2-1 to 2-4 shield members 1800-1, 1800-2, 1800-3, and 1800-4.

FIGS. 26A and 26B are perspective views of the 2-1 shield member 1800-1 and the 2-2 shield member 1800-3, and FIGS. 26C and 26D are perspective views of the 2-2 shield member 1800-2 and the 2-4 shield member 1800-4. In this case, each of the second shield member 1800 may include a first shield surface 1810 disposed on the upper surface of the guide member 1700 and a second shield surface 1820 protruding from the first shield surface 1810 toward the first surface 1110 of the fluid flow part 1100. The second shield surface 1820 may be disposed between the side surface of the guide member 1700 and the side surface of the thermoelectric element disposed adjacent to the guide member 1700, and edges of the second shield surface 1820 and the first shield surface 1810 may be sealed by a sealing member (not shown). Therefore, it is possible to prevent moisture, the second fluid, or contaminants from permeating into the thermoelectric element.

Although not shown, a heat insulating member may be further disposed between the fluid flow part 1100 and the second shield member 1800 or between the side surface of the guide member 1700 and the side surface of the thermoelectric element disposed adjacent to the guide member 1700, and in this case, the heat insulating member may be disposed between the one surface 1110 of the fluid flow part 1100 and the second shield surface 1820. Therefore, it is possible to prevent the heat of the second fluid flowing along the second shield member 1800 from being transmitted to the fluid flow part 1100 through the second shield member 1800.

Meanwhile, the second shield member 1800 may be coupled to the guide member 1700 using a coupling member 1370. To this end, a plurality of through holes S42 may be formed in the first guide region B1 of the guide member 1700, and a plurality of through holes S43 corresponding to the plurality of through holes S42 may be formed in the second shield member 1800, and the second shield member 1800 may be coupled to the guide member 1700 by the coupling member 1360 passing through the plurality of through holes S42 and the plurality of through holes S43.

Therefore, not only the plurality of through holes S32 to which the fluid flow part 1100 is coupled, but also the plurality of through holes to which the second shield member 1800 is coupled may be formed in the first guide region B1 of the guide member 1700. Like the plurality of through holes S32, the plurality of through holes S42 may also be disposed so that a virtual line connecting the plurality of through holes S42 forms a predetermined polygonal shape, for example, a rectangle or a square. In this case, the plurality of through holes S32 and the plurality of through holes S42 may be disposed to be misaligned with each other in the X direction or the Y direction in one first guide region B1. For example, the plurality of through holes S42 in one row may be disposed between the plurality of through holes S32 in two rows, and the plurality of through holes S42 in one row may be disposed between the plurality of through holes S32 in two rows. Therefore, a coupling force between the guide member 1700 and the fluid flow part 1100 and a coupling force between the guide member 1700 and the second shield member 1800 may be balanced.

Meanwhile, in the power generation device according to the embodiment of the present invention, the first guide member 1700-1 may be disposed on one side of the first surface 1110 of the fluid flow part 1100, the second guide member 1700-1 may be disposed on the other side thereof, and each of a 2-1 shield member 1800-1 and a 2-2 shield member 1800-2 may be disposed on each of the first guide member 1700-1 and the second guide member 1700-2. As described above, the positions of the groove 1702 and the holes 1706 and 1708 formed in the first guide member 1700-1 and the positions of the groove 1702 and the holes 1706 and 1708 formed in the second guide member 1700-2 may be different from each other. Likewise, at least one of the shape, position, and number of plurality of through holes S32 and S42 formed in the first guide member 1700-1 and at least one of the shape, position, and number of plurality of through holes S32 and S42 formed in the second guide member 1700-2 may be different from each other. The positions and numbers of plurality of through holes S32 and S42 may be variously changed to efficiently guide the wire and evenly distribute the coupling force.

As described above, in the power generation device according to the embodiment of the present invention, the first guide member 1700-1 may be disposed on one side of the first surface 1110 of the fluid flow part 1100, the second guide member 1700-2 may be disposed on the other side thereof, the third guide member 1700-3 may be disposed on one side of the second surface 1120, and the fourth guide member 1700-4 may be disposed on the other side thereof. In addition, each of the 2-1 shield member 1800-1, the 2-2 shield member 1800-2, a 2-3 shield member 1800-3, and a 2-4 shield member 1800-4 may be disposed on each of the first guide member 1700-1, the second guide member 1700-2, the third guide member 1700-3, and the fourth guide member 1700-4.

The first guide member 1700-1 and the third guide member 1700-3 are disposed opposite to each other with the fluid flow part 1100 therebetween, and the second guide member 1700-2 and the fourth guide member 1700-4 may be disposed opposite to each other with the fluid flow part 1100 interposed therebetween. In addition, each of the 2-1 shield member 1800-1, the 2-2 shield member 1800-2, the 2-3 shield member 1800-3, and the 2-4 shield member 1800-4 may further include a third shield surface 1830 extending from the first shield surface 1810 and disposed on the third surface 1130 of the fluid flow part 1100. In addition, the wire W may be drawn out from at least one of gaps between the third shield surface 1830 of the 2-1 shield member 1800-1 and the third shield surface 1830 of the 2-3 shield member 1800-3 and between the third shield surface 1830 of the 2-2 shield member 1800-2 and the third shield surface 1830 of the 2-4 shield member 1800-4, and at least one of the gaps between the third shield surface 1830 of the 2-1 shield member 1800-1 and the third shield surface 1830 of the 2-3 shield member 1800-3 and between the third shield surface 1830 of the 2-2 shield member 1800-2 and the third shield surface 1830 of the 2-4 shield member 1800-4 may be sealed by the sealing member (not shown).

When a plurality of power generation devices are disposed in a predetermined space, it is possible to enhance power generation efficiency as the number of power generation devices accommodated per unit volume increases. Therefore, it is necessary to efficiently accommodate the plurality of power generation devices.

According to the embodiment of the present invention, the positions of the plurality of through holes S42 of the first guide member 1700-1 and the positions of the plurality of through holes S42 of the third guide member 1700-3 may be formed to be misaligned with each other, and the positions of the plurality of through holes S43 of the 2-1 shield member 1800-1 and the positions of the plurality of through holes S43 of the 2-3 shield member 1800-3 may be formed to be misaligned with each other. Likewise, the positions of the plurality of through holes S42 of the second guide member 1700-2 and the positions of the plurality of through holes S42 of the fourth guide member 1700-4 may be formed to be misaligned with each other, and the positions of the plurality of through holes S43 of the 2-2 shield member 1800-2 and the positions of the plurality of through holes S43 of the 2-4 shield member 1800-4 may be formed to be misaligned with each other. Therefore, as shown in FIG. 28, when the plurality of power generation devices are disposed in parallel, even when the interval between the power generation devices is narrow, it is possible to reduce the possibility of the contact with a coupling member coupled to a shield member of another power generation device. Therefore, it is possible to reduce the interference between different power generation devices and enhance power generation performance per unit volume.

In the specification, the power generation device including the thermoelectric module or the Peltier device may be collectively referred to as a thermoelectric device.

A power generation system can generate power through a heat source generated from ships, automobiles, power plants, geothermal, or the like and have a plurality of power generation devices disposed therein in order to efficiently converge the heat source. In this case, since each power generation device can improve the cooling performance of the low-temperature part of the thermoelectric element by improving the bonding force between the thermoelectric module and the fluid flow part, thereby improving the efficiency and reliability of the power generation device, it is possible to improve the fuel efficiency of transportation devices, such as ships or vehicles. Therefore, in the shipping industry and the transportation industry, it is possible to reduce the transportation cost and create an eco-friendly industrial environment and reduce the material cost or the like when the power generation device is applied to manufacturing industries, such as steel mills.

Although the above description has been made with reference to exemplary embodiments of the present invention, those skilled in the art will be able to understand that the present invention may be variously modified and changed without departing from the spirit and scope of the present invention described in the appended claims.

The invention claimed is:

1. A thermoelectric device comprising:
a fluid flow part including one surface and another surface spaced apart from the one surface in a first direction;
a first thermoelectric element disposed on the one surface of the fluid flow part and including a first electrode part, a semiconductor structure part disposed on the first electrode part and a second electrode part disposed on the semiconductor structure part;
a first heat sink disposed on the first thermoelectric element;
a connector part disposed on one side of the first thermoelectric element and connected to the first thermoelectric element;
a second thermoelectric element disposed on the other surface of the fluid flow part;
a first shield member disposed on the first thermoelectric element;
a second shield member disposed on the second thermoelectric element; and
a first guide member and a second guide member disposed to be spaced apart from each other with the first thermoelectric element interposed therebetween on the one surface of the fluid flow part,
wherein a first coupling hole to which a first coupling member is coupled is formed in the one surface of the fluid flow part and the first shield member,
wherein a second coupling hole to which a second coupling member is coupled is formed in the other surface of the fluid flow part and the second shield member,
wherein the first coupling hole and the second coupling hole are disposed to be misaligned with each other in the first direction,
wherein a first through hole is formed in the first shield member, and the first heat sink passes through the first through hole,
wherein a second through hole is further formed in the first shield member, and the second through hole is disposed to perpendicularly overlap the connector part, and
wherein a width of each of the first guide member and the second guide member in a second direction from the first guide member toward the second guide member is 0.9 to 1.1 times a width of the first thermoelectric element.

2. The thermoelectric device of claim 1, further comprising a sealing member disposed between the first through hole and the first heat sink.

3. The thermoelectric device of claim 1, further comprising a cover member disposed on a portion of an upper surface of the connector part,
wherein a width of the second through hole is greater than a width of the upper surface of the connector part.

4. The thermoelectric device of claim 3, wherein an area of the second through hole is smaller than an area of the first through hole.

5. The thermoelectric device of claim 1, wherein a third through hole is further formed in the first shield member, and
wherein at least a portion of the third through hole overlaps a region where a plurality of wires overlap.

6. The thermoelectric device of claim 1, wherein at least one of the first guide member and the second guide member guides a wire connected to the connector part.

7. The thermoelectric device of claim 6, wherein at least one of the first guide member and the second guide member includes a first guide region disposed on a side surface of the first thermoelectric element and a second guide region protruding from the first guide region and disposed on a side surface of the connector part,
wherein at least one groove extending in the second direction is formed in the second guide region, and
the wire connected to the connector part is guided in the second direction through the at least one groove.

8. The thermoelectric device of claim 1, further comprising a sealing member disposed along at least a portion of an edge of the first shield member.

9. The thermoelectric device of claim 1,
wherein the first shield member includes a first shield part disposed on the one surface of the fluid flow part, a second shield part connected to the first shield part and including a region where the first through hole is formed, a third shield part connected to the second shield part and including a region where the second through hole is formed, and a fourth shield part connected to the third shield part and disposed on the fluid flow part,
wherein a height of the second shield part is disposed to be greater than heights of the first shield part and the fourth shield part, and a height of the third shield part is disposed to be greater than the first shield part, the second shield part, and the fourth shield part with respect to the one surface of the fluid flow part.

10. The thermoelectric device of claim 9, wherein the first shield member further includes a support part extending from the first shield part and disposed on a surface perpendicular to the one surface of the fluid flow part.

11. The thermoelectric device of claim 10, wherein the support part includes a plurality of support regions disposed to be spaced apart from each other.

12. The thermoelectric device of claim 11, wherein the first shield member further includes a protrusion disposed in the third shield part and protruding to at least partially overlap a region where a plurality of wires overlap.

13. The thermoelectric device of claim 4, wherein the second through hole is sealed by a sealing member.

14. The thermoelectric device of claim 5, wherein an area of the third through hole is different from an area of the first through hole and an area of the second through hole.

15. The thermoelectric device of claim 7, wherein a width of the first guide region in the second direction is greater than a width of the second guide region in the second direction.

16. The thermoelectric device of claim 7, wherein two holes formed in a third direction perpendicular to the first direction and the second direction are formed in the first guide region, and the wire guided through the at least one groove is guided in the third direction through the two holes.

17. The thermoelectric device of claim 7, wherein a plurality of 1-1 through holes is formed in the first guide region, a plurality of 1-2 through holes corresponding to the plurality of 1-1 through holes is formed in the fluid flow part, and the first guide region and the fluid flow part are coupled by a coupling member passing through the plurality of 1-1 through holes and the plurality of 1-2 through holes.

18. A thermoelectric device comprising:
- a fluid flow part including one surface and another surface spaced apart from the one surface in a first direction;
- a first thermoelectric element disposed on the one surface of the fluid flow part and including a first electrode part, a semiconductor structure part disposed on the first electrode part and a second electrode part disposed on the semiconductor structure part;
- a first heat sink disposed on the first thermoelectric element;
- a connector part disposed on one side of the first thermoelectric element and connected to the first thermoelectric element;
- a second thermoelectric element disposed on the other surface of the fluid flow part;
- a first shield member disposed on the first thermoelectric element; and
- a second shield member disposed on the second thermoelectric element,
- wherein a first coupling hole to which a first coupling member is coupled is formed in the one surface of the fluid flow part and the first shield member,
- wherein a second coupling hole to which a second coupling member is coupled is formed in the other surface of the fluid flow part and the second shield member,
- wherein the first coupling hole and the second coupling hole are disposed to be misaligned with each other in the first direction,
- wherein a first through hole is formed in the first shield member, and the first heat sink passes through the first through hole,
- wherein a second through hole is further formed in the first shield member, and the second through hole is disposed to perpendicularly overlap the connector part,
- wherein the first shield member includes a first shield part disposed on the one surface of the fluid flow part, a second shield part connected to the first shield part and including a region where the first through hole is formed, a third shield part connected to the second shield part and including a region where the second through hole is formed, and a fourth shield part connected to the third shield part and disposed on the fluid flow part,
- wherein a height of the second shield part is disposed to be greater than heights of the first shield part and the fourth shield part, and a height of the third shield part is disposed to be greater than the first shield part, the second shield part, and the fourth shield part with respect to the one surface of the fluid flow part,
- wherein the first shield member further includes a support part extending from the first shield part and disposed on a surface perpendicular to the one surface of the fluid flow part,
- wherein the support part includes a plurality of support regions disposed to be spaced apart from each other, and
- wherein the first shield member further includes a protrusion disposed in the third shield part and protruding to at least partially overlap a region where a plurality of wires overlap.

* * * * *